US012805155B2

(12) United States Patent
Wu et al.

(10) Patent No.: US 12,805,155 B2
(45) Date of Patent: Nov. 17, 2026

(54) BACKING FILMS FOR DISPLAYS WITH CURVED SURFACES

(71) Applicant: Apple Inc., Cupertino, CA (US)

(72) Inventors: Bulong Wu, San Jose, CA (US); Zhen Zhang, Sunnyvale, CA (US); Paul S Drzaic, Morgan Hill, CA (US); Yong Sun, San Jose, CA (US); Izhar Z Ahmed, Saratoga, CA (US); Kuan H Lu, Santa Clara, CA (US); Han-Chieh Chang, San Jose, CA (US); Mingjing Ha, Cupertino, CA (US); Yung-Yu Hsu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 383 days.

(21) Appl. No.: 18/568,070

(22) PCT Filed: May 10, 2022

(86) PCT No.: PCT/US2022/028527

§ 371 (c)(1),
(2) Date: Dec. 7, 2023

(87) PCT Pub. No.: WO2022/271282

PCT Pub. Date: Dec. 29, 2022

(65) Prior Publication Data

US 2024/0373721 A1 Nov. 7, 2024

Related U.S. Application Data

(60) Provisional application No. 63/214,961, filed on Jun. 25, 2021.

(51) Int. Cl.

| | |
|---|---|
| ***H10K 59/80*** | (2023.01) |
| ***H10K 77/10*** | (2023.01) |
| *H10K 102/00* | (2023.01) |

(52) U.S. Cl.

CPC ......... *H10K 59/871* (2023.02); *H10K 77/111* (2023.02); *H10K 2102/311* (2023.02)

(58) Field of Classification Search

CPC ............................ H10K 59/871; H10K 77/111

See application file for complete search history.

(56) References Cited

U.S. PATENT DOCUMENTS

| | | | |
|---|---|---|---|
| 9,377,174 | B2 | 6/2016 | Watanabe |
| 9,419,065 | B2 | 8/2016 | Degner et al. |

(Continued)

FOREIGN PATENT DOCUMENTS

| | | |
|---|---|---|
| CN | 105513497 A | 4/2016 |
| CN | 107068695 A | 8/2017 |

(Continued)

*Primary Examiner* — Dale E Page

*Assistant Examiner* — Wilner Jean Baptiste

(74) *Attorney, Agent, or Firm* — Treyz Law Group, P.C.; Joseph F. Guihan; Jinie M. Guihan

(57) ABSTRACT

An electronic device may have a display overlapped by a display cover layer. Portions of the surface of the display and cover layer may have curved profiles. For example, a display cover layer may have transparent sidewall portions with curved surface profiles. The transparent sidewall portions of the display cover layer may include rounded corners having areas of compound curvature. A flexible display panel may be pressed over a mold to impart desired curvature (such as compound curvature) to the flexible display panel. To mitigate wrinkling in a flexible display panel molded to have compound curvature, a backfilm may be included that absorbs compressive strains in the display panel. The backfilm may have a coefficient of thermal expansion that is higher than that of the display panel. Instead or in addition, the backfilm may have portions with different Young's modulus magnitudes or different thickness magnitudes.

20 Claims, 31 Drawing Sheets

(56) References Cited

U.S. PATENT DOCUMENTS

| | | | |
|---|---|---|---|
| 9,530,831 | B2 | 12/2016 | Lee et al. |
| 10,514,724 | B2 | 12/2019 | Hamburgen et al. |
| 10,782,573 | B2 * | 9/2020 | Park .................... G02F 1/13452 |
| 2012/0218219 | A1 | 8/2012 | Rappoport et al. |
| 2017/0031472 | A1 * | 2/2017 | Ma ......................... G06F 1/1637 |
| 2017/0062773 | A1 * | 3/2017 | Lee ........................ G06F 1/1618 |
| 2019/0152129 | A1 | 5/2019 | Franklin et al. |
| 2020/0142449 | A1 | 5/2020 | Nakatogawa |

FOREIGN PATENT DOCUMENTS

| | | | |
|---|---|---|---|
| CN | 108806515 | A | 11/2018 |
| CN | 111161644 | A | 5/2020 |
| CN | 111385390 | A | 7/2020 |
| CN | 111417894 | A | 7/2020 |
| CN | 111754861 | A | 10/2020 |
| CN | 112038371 | A | 12/2020 |
| CN | 105093615 | A | 11/2025 |
| KR | 20160027944 | A | 3/2016 |
| KR | 1020180034832 | A | 4/2018 |

* cited by examiner

BACKING FILMS FOR DISPLAYS WITH CURVED SURFACES

This application claims priority to U.S. provisional patent application No. 63/214,961, filed Jun. 25, 2021, which is hereby incorporated by reference herein in its entirety.

FIELD

This relates generally to electronic devices, and, more particularly, to electronic devices with displays.

BACKGROUND

Electronic devices such as cellular telephones, tablet computers, and other electronic equipment may include displays for presenting images to a user.

If care is not taken, electronic devices with displays may not have a desired appearance or may be difficult to use satisfactorily. For example, displays may be bulky and unattractive or may not accommodate a desired electronic device shape.

SUMMARY

An electronic device may have a display overlapped by a display cover layer. Portions of the surface of the display and cover layer may have curved profiles. For example, a display cover layer may have transparent sidewall portions with curved surface profiles. The transparent sidewall portions of the display cover layer may include rounded corners having areas of compound curvature.

The display of the electronic device may include a flexible substrate. For example, the display may include a flexible display layer such as an organic light-emitting diode (OLED) display layer with an array of pixels configured to display images for a user. The display layer may have bent edge and corner portions that conform to the curvature (including compound curvature) of the display cover layer.

In one possible arrangement, a flexible display panel may be pressed over a mold to impart desired curvature to the flexible display panel. With this type of arrangement, a unitary flexible display panel may be imparted with compound curvature in a corner region of the electronic device. However, shaping the flexible display panel to have compound curved corners may impart compressive stress on the flexible display panel in the corner, which may cause undesired wrinkling or buckling in the flexible display panel. Another problem that may arise while shaping a flexible display panel to have compound curved corners is the flexible display panel itself cracking (due to tensile strain generated during the manufacturing process). Therefore, to mitigate these issues while molding a flexible display panel to have compound curvature, a backfilm may be included that absorbs strains in the display panel.

The backfilm may have a coefficient of thermal expansion that is higher than that of the display panel. The coefficient of thermal expansion mismatch may cause the backfilm to oppose the compressive stress on the flexible display panel caused by bending, thus mitigating wrinkling in the flexible display panel.

Instead or in addition, the backfilm may have portions with different Young's modulus magnitudes or different thickness magnitudes. Patches having a high Young's modulus or thickness may overlap each corner of the display panel. The backfilm may have portions with a Young's modulus or thickness gradient. The backfilm may be stretched during the molding process.

DETAILED DESCRIPTION

Electronic devices may be provided with displays. The displays may have planar surfaces and curved surfaces. For example, a display may have a planar central portion surrounded by bent edges. The bent edges may have curved surface profiles. Arrangements in which displays exhibit compound curvature may also be used. Electronic devices having displays with curved surfaces may have an attractive appearance, may allow the displays to be viewed from a variety of different angles, and may include displays with a borderless or nearly borderless configuration.

Figure 1:
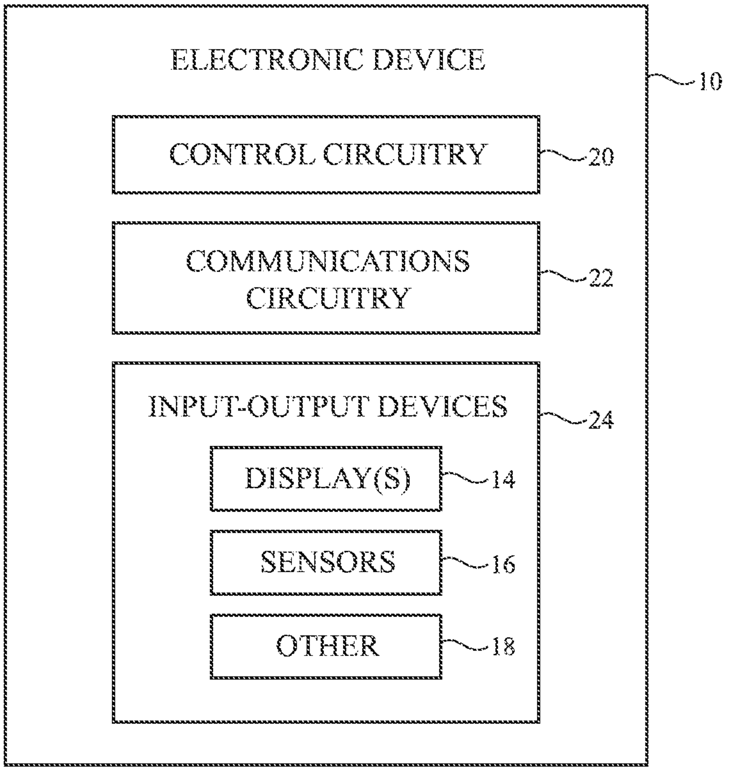
FIG. 1 is a schematic diagram of an illustrative electronic device in accordance with an embodiment.

A schematic diagram of an illustrative electronic device having a display with curved surface portions is shown in FIG. 1. Device 10 may be a cellular telephone, a tablet computer, a laptop computer, a wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. During operation, control circuitry 20 may use sensors and other input devices in devices 24 to gather input and can control output devices in devices 24 to provide desired output.

Devices 24 may include one or more displays such as display(s) 14. An output device such as display 14 may be an organic light-emitting diode (OLED) display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 18 in input-output devices 24). The additional components may include haptic output devices, audio output devices such as speakers, light producing output devices such as light-emitting diodes for status indicators, light sources such as light-emitting diodes (e.g., crystalline semiconductor light-emitting diodes) that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
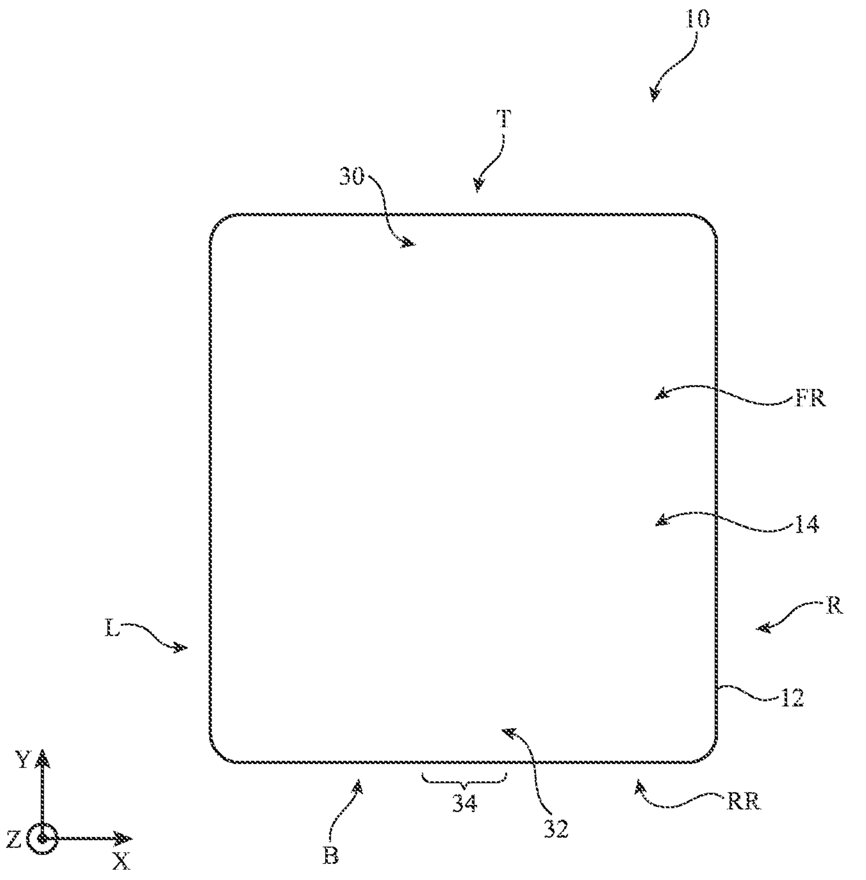
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). In some illustrative arrangements, sidewall portions of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more display panels in device 10 as separate touch sensor panels overlapping display pixels or may be formed as part of one or more display panels in device 10. Touch sensors may be formed on front face FR, rear face RR, and/or edges (sidewall faces) T, B, R, and/or L. If desired, icons and other images for virtual buttons may be displayed by the pixels of device. For example, virtual buttons and/or other images may be displayed on front face FR, rear face RR, and/or sidewall structures in device 10 such as edges T, B, R, and/or L and may overlap touch sensor circuitry. Haptic output devices may be used to provide haptic feedback when virtual buttons are selected (as an example).

Device 10 of FIG. 2 has a rectangular outline with four rounded corners. If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A finger print sensor, touch sensor button, force-sensitive button, or other sensor that operates through display 14 may be formed under the portion of display in lower region 32 on front face FR and/or other portions of front face FR and/or other external surfaces of device 10. An optional opening for a connector (e.g., a digital data connector, analog signal connector, and/or power connector) may be formed in portion 34 of the lower sidewall of device 10 running along lower edge B. This opening may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
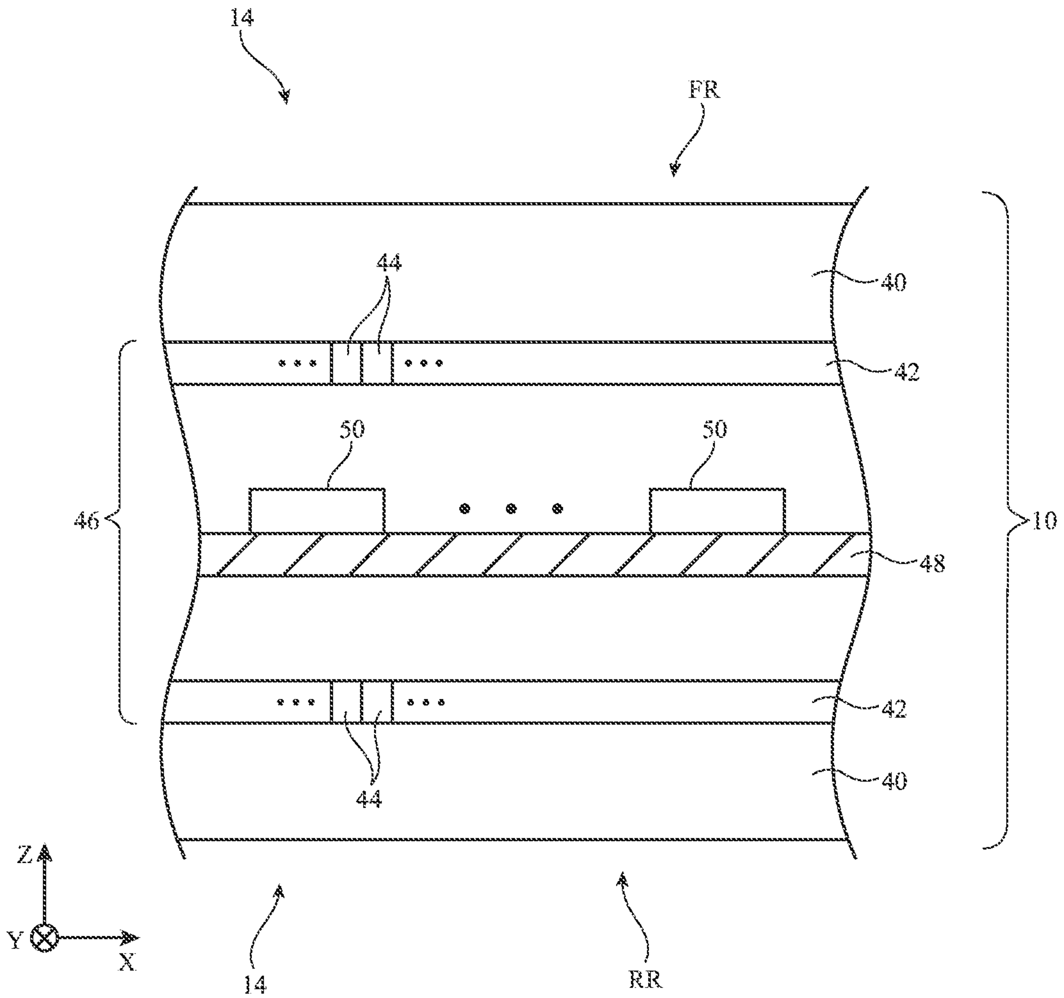
FIG. 3 is a cross-sectional side view of an illustrative electronic device in accordance with an embodiment.

FIG. 3 is a cross-sectional side view of an illustrative electronic device. As shown in FIG. 3, display 14 may be formed on front face FR and/or rear face RR of device 10. Display 14 may include one or more transparent protective layers such as display cover layer 40. Display cover layer 40 may be formed from transparent material such as clear glass, polymer, sapphire or other crystalline material, or other transparent material. Display layers such as layers 42 may have arrays of pixels 44 that form images. The pixel arrays (e.g., layers 42) may sometimes be referred to as pixel layers, pixel array layers, displays, display structures, display layers, or display panels. For example, layers 42 may be formed from organic light-emitting diode displays. In the example of FIG. 3, device 10 has a first display 14 (or first display portion of a display panel or other display structure) formed from a first pixel array 42 on front face FR. This first pixel array is visible in the −Z direction through display cover layer 40 on front face FR. Device 10 of FIG. 3 also has a second display 14 (or second display portion of the display panel or other display structure) formed from a second pixel array 42 on rear face RF. This second pixel array is visible in the +Z direction through display cover layer 40 on rear face RR. The front and/or rear surfaces formed by display cover layer(s) 40 may be planar (as shown in FIG. 3) or may have a curved profile.

If desired, the second display 14 of device 10 may be omitted. For example, pixel array 42 on rear face RR may be omitted. In this configuration, the inner surface of layer 40 on rear face RR may be coated with a black masking material or other opaque coating and/or may be coated with colored and/or shiny structures. Coating material can be patterned to form logos, text, and other visual elements. This type of arrangement may be used to hide internal components in interior 46 of device from view from the exterior of device 10. As shown in FIG. 3, for example, device 10 may include electrical components 50 in interior 46 (e.g., integrated circuits, sensors and other input-output devices, control circuitry, display layers 42 such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material). In configurations such as these in which the lower pixel array of device 10 is omitted, the portion of device 10 on rear face RR (e.g., layer 40) may be formed from metal (e.g., a stainless steel or aluminum layer). For example, device 10 may have a rear housing wall formed from metal. Device 10 may also have housing walls formed from opaque glass, transparent glass coated with opaque materials such as ink or metal, and/or other housing wall materials.

In some configurations for device 10, an opaque material such as metal or opaque polymer may form some or all of the sidewalls of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of display cover layers 40 of FIG. 3 (e.g., an extending piece of glass, polymer, crystalline material, or other transparent display cover layer material). Because clear layers of glass, plastic, crystalline material, and/or other clear layers of material in device 10 may enclose and protect internal device components, these outer layers of material in device 10 serve as an enclosure (housing 12) for device 10.

In configurations for device 10 in which sidewalls have transparent portions formed from extending portions of display cover layers 40 or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light-emitting devices may be placed under clear sidewalls.

During operation, light emitted from the pixels or other light-emitting components under the sidewalls may pass through the sidewalls. In arrangements in which display panels are placed under transparent sidewalls, images may be displayed through the sidewalls. The images may form parts of images being displayed on front face FR and/or rear face RR and/or may be separate images. For example, a photograph may extend across front face FR and some or all of the sidewalls of device 10 and/or a photograph may cover only front face FR while virtual buttons are displayed on the sidewalls of device 10. In arrangements in which one or more light-emitting diodes and an overlapping diffuser are placed under transparent sidewalls, diffuse light may be emitted through the sidewalls.

In addition to optional opaque housing structures such as metal housing walls or opaque walls formed from other materials, device 10 may include display cover layers 40 and other structures formed from transparent glass, transparent polymer, and/or other transparent material. These materials may surround the interior of device 10 and thereby serve as a housing for device 10 as well as serving as protective layers for pixel arrays and other light-emitting components. In the example of FIG. 3, the front surface of device 10 is formed by a planar surface of display cover layer 40 on front face FR and the rear surface of device 10 is formed by a planar surface of display cover layer 40 on rear face RR. In general, device 10 may have planar surface portions and/or curved surface portions (surface portions with curved profiles) and these portions may be formed by display cover layers, other layers formed from glass, polymer, sapphire or other crystalline material, ceramic, or other potentially transparent materials, metal, wood, or other materials.

Figure 4:
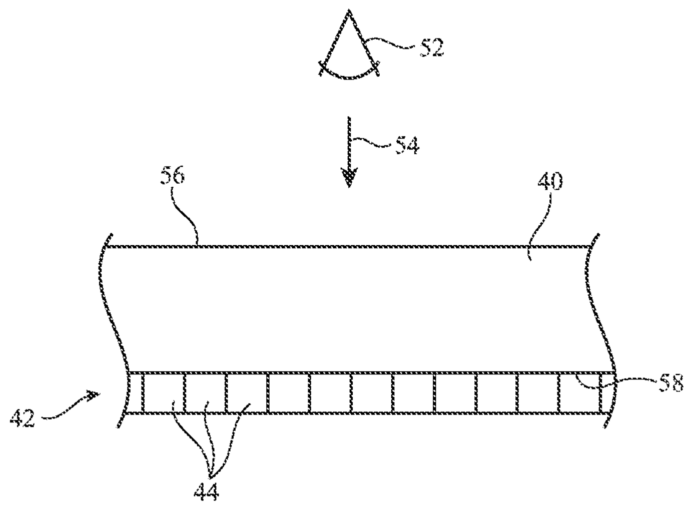
FIG. 4 is a cross-sectional side view of an illustrative planar portion of a display cover layer and pixel array in accordance with an embodiment.
Figure 5:
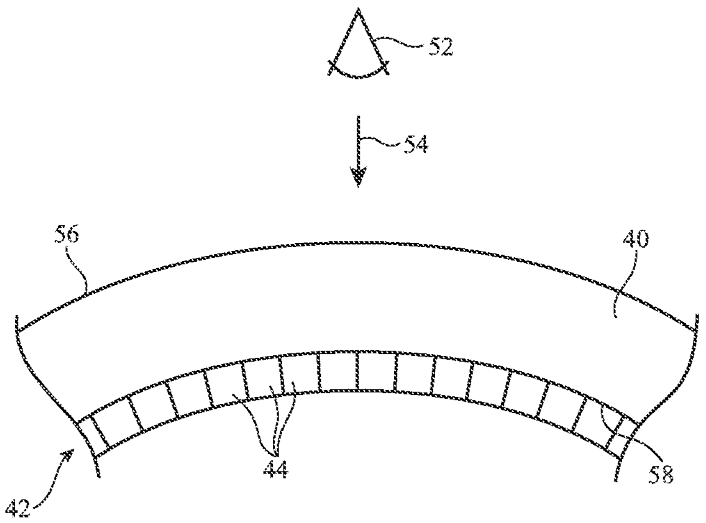
FIG. 5 is a cross-sectional side view of an illustrative curved portion of a display cover layer and pixel array in accordance with an embodiment.

Transparent portions of device 10 may overlap pixels or other light-emitting components that emit light that is visible to a user. In the illustrative arrangements of FIGS. 4 and 5, an array of pixels 44 in layer 42 is configured to emit light that passes through display cover layer 40 for viewing by viewer 52 (e.g., in direction 54 and/or other directions from the exterior of device 10). The inner and outer surface of layers 40 (and other layers enclosing the interior of device 10) may be planar and/or curved. In the illustrative configuration of FIG. 4, outer surface 56 of layer 40 and inner surface 58 of layer 40 are planar. Inner surface 58 of FIG. 4 may be curved or partly planar and partly curved, if desired. In the illustrative configuration of FIG. 5, outer surface 56 of layer 40 is curved and inner surface 58 of layer 40 is curved. Inner surface 58 may, if desired, be planar or may have planar and curved surface profile portions.

Figure 6:
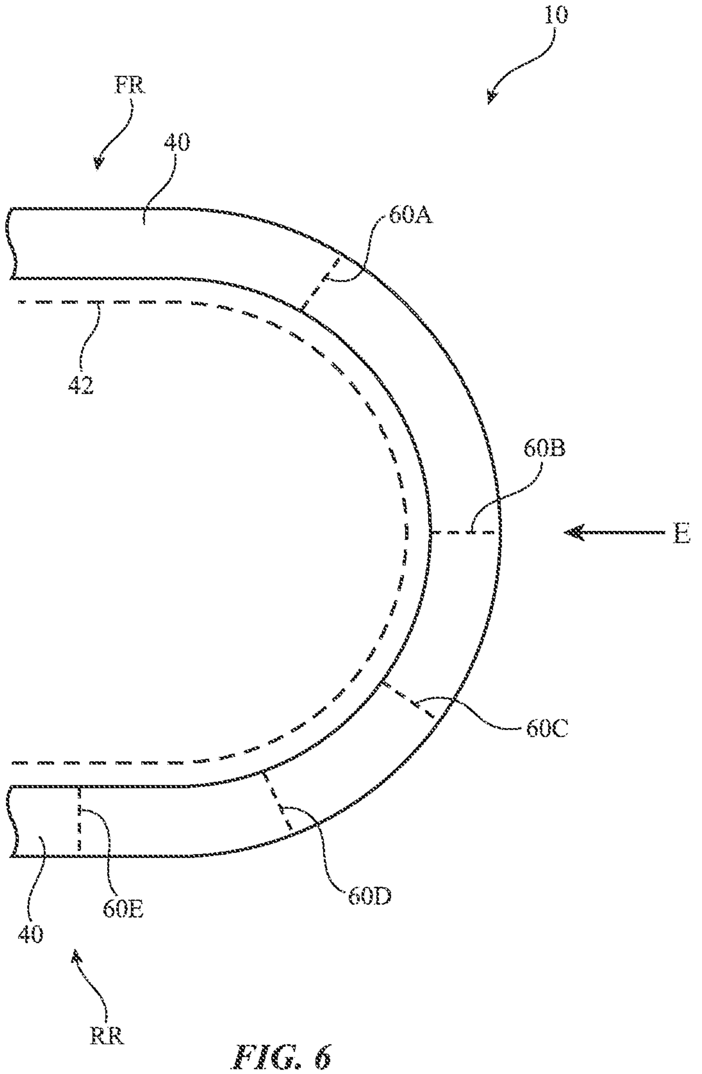
FIG. 6 is a cross-sectional side view of an illustrative sidewall portion of an electronic device in accordance with an embodiment.

Device 10 may have upper and/or lower surfaces (e.g., external surfaces 56 on front face FR and rear face RR, respectively) that are planar and/or curved. The edges of device 10 may have sidewalls with planar and/or curved portions (e.g., surfaces with straight and/or curved profiles). As shown in FIG. 6, for example, the sidewalls of device 10 along one or more edges such as edge E of device 10 (e.g., left edge L, right edge R, upper edge T, lower edge B, and/or the corners of device 10) may have a curved outer surface.

Edge E may be transparent (e.g., the entire sidewall of device 10 may be transparent and may be formed from extended portions of upper and lower display cover layer(s)) and/or one or more portions of the curved sidewall of edge E may be opaque (e.g., formed from glass or other material that is coated with opaque material, formed from opaque polymer, formed from metal, and/or formed from other opaque structures). Opaque structures (e.g., metal housing wall portions) may extend along one or more portions of edge E (e.g., metal or other opaque material may form the portion of edge E between locations 60A and 60B, between locations 60B and 60C, between locations 60C and 60D, between locations 60D and 60E, between locations 60A and 60C, between locations 60B and 60D, between locations 60C and 60E, or between other suitable locations on edge E). There may be a single strip of metal housing material that runs around all four peripheral edges E of device 10, there may be a pair of discrete strips of metal housing material that run around all four peripheral edges E in parallel, there may be no non-glass structures on edges E, and/or there may be other suitable structures on edges E.

Display layer 42 may be formed from a single panel (e.g., a single flexible organic light-emitting diode display panel having a polyimide substrate or other flexible substrate with bent edge portions), may be formed from multiple panels (e.g., multiple panels separated from one or more gaps), may be formed from panels with slots and other openings, and/or may be formed from other types of displays. Portions of display layer 42 (e.g., all of layer 42 and/or the pixels and/or other structures of layer 42) may be omitted wherever layer 42 is overlapped by a metal portion of edge E and/or other opaque structures in edge E. For example, edge E may be formed from glass everywhere except between locations 60B and 60D. The portion of edge (sidewall) E between locations 60B and 60D may be formed from metal (as an example). In this type of scenario, no display layer 42 (or at least no pixels 44) may be overlapped by the metal and pixels 44 and display layer 42 may be present under the glass portions of edge E and/or display cover layer 40 on front face FR and/or rear face RR.

Figure 7:
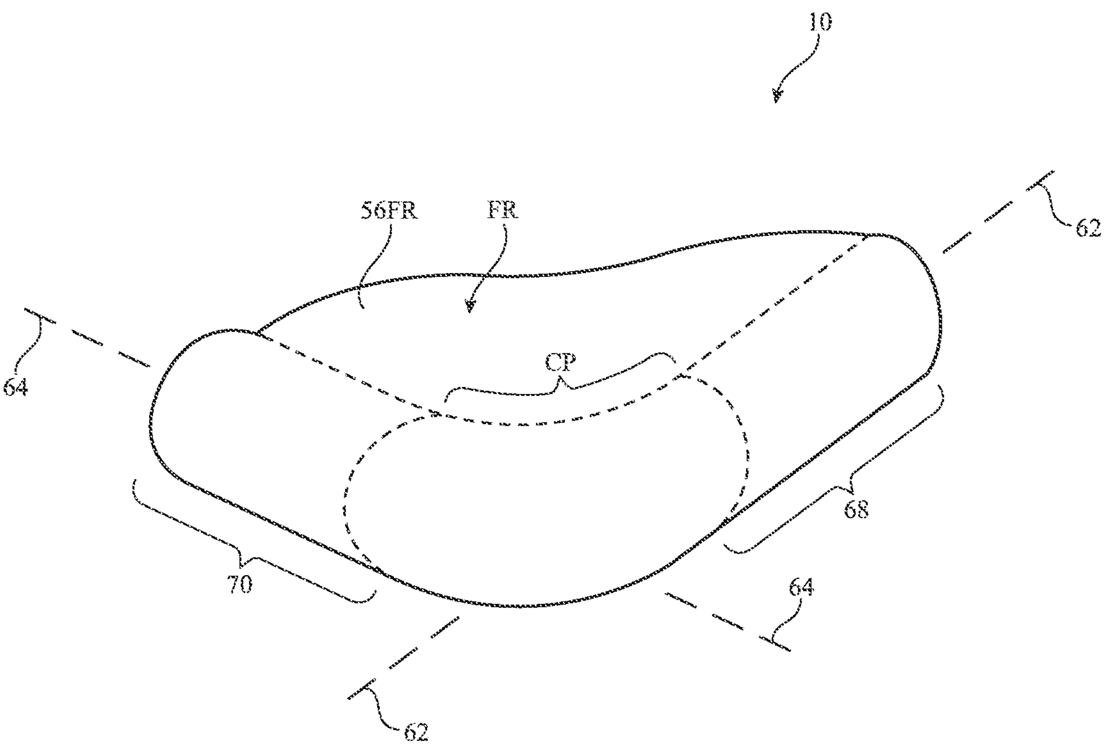
FIG. 7 is a perspective view of an illustrative corner portion of an electronic device in accordance with an embodiment.

If desired, device 10 may have external surfaces with compound curvature. A perspective view of an illustrative corner portion of device 10 is shown in FIG. 7. In the example of FIG. 7, device 10 has edge portions (sidewalls) 68 and 70 with surfaces that curve about axes 62 and 64, respectively. These portions extend along the straight sides of device 10 and are characterized by curved surfaces that can be flattened into a plane without distortion (sometimes referred to as developable surfaces). At the corner of device 10, device 10 has curved surface portions CP with compound curvature (e.g., a surface that can only be flattened into a plane with distortion, sometimes referred to as a surface with Gaussian curvature). Each of the four corners of device 10 may have this arrangement, if desired.

Flexible displays such as organic light-emitting diode displays with flexible polyimide substrates or other bendable polymer substrates can be bent about axes such as axes 62 and 64 to form curved surfaces in portions 68 and 70. In compound curvature regions such as corner regions of device 10, display 14 can be formed from materials that stretch (e.g., displays formed from mesh-shaped elastomeric substrate material), may be formed from flexible displays that are patterned to create flexible strips and other structures that can be bent to cover at least part of the compound curvature regions, and/or may use optical structures (e.g., lenses, etc.) to redirect light emitted from pixels in a display to surfaces with compound curvature.

In one possible arrangement, a flexible display panel (such as an organic light-emitting diode display with a flexible polyimide substrate) may be pressed over a mold to impart desired curvature to the flexible display panel. With this type of arrangement, a unitary flexible display panel may be imparted with compound curvature in a corner region of the device (e.g., as shown in FIG. 7). However, molding the flexible display panel (which is initially planar) to have compound curvature may present challenges. Shaping the flexible display panel to have compound curved corners may impart compressive stress on the flexible display panel in the corner, which may cause undesired wrinkling or buckling in the flexible display panel. The flexible display panel may be cut to relieve the compressive stress and mitigate wrinkling, but this may cause undesired visible seams in the display. Another problem that may arise while shaping a flexible display panel to have compound curved corners is the flexible display panel itself cracking (due to tensile strain generated during the manufacturing process). To mitigate wrinkling and/or cracking in a flexible display panel molded to have compound curvature, a backfilm may be included that absorbs strains in the display panel.

Figure 8:
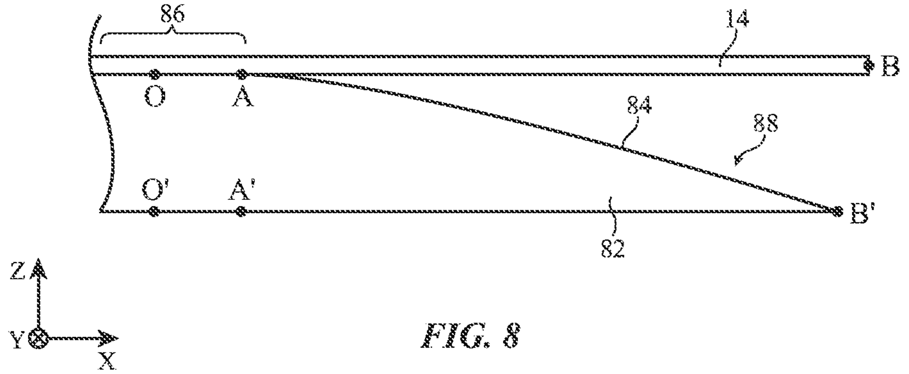
FIG. 8 is a cross-sectional side view of a flexible display panel adjacent to a mold before the flexible display panel is bent in accordance with an embodiment.

FIGS. 8-11 illustrate how shaping the flexible display panel to have compound curvature in the corner region may result in extra material in the compound corner, causing compressive strain and, if care is not taken, wrinkling. In FIG. 8 (a cross-sectional side view), a flexible display panel 14 is pictured over a mold 82. Before the flexible display panel 14 is pressed over mold 82, flexible display 14 is planar. Mold 82 has an upper surface 84 with a planar central portion 86 and curved edge portions 88. Both mold 82 and display panel 14 may have a footprint that has rounded corners (e.g., a square footprint with rounded corners, a non-square rectangular footprint with rounded corners, etc.).

FIG. 8 shows various points on both the display panel 14 and mold 82. Point O on display panel 14 overlaps a corresponding point O' of mold 82. Points O and O' are in a planar central region of the mold and therefore the display will not be bent at point O during the molding process. Points A and A' are at the transition between the planar central portion of the mold and the curved edges of the mold. In other words, the flexible display panel will start to bend at point A. Finally, points B and B' are at the edges of the display panel and mold, respectively.

Figure 9:
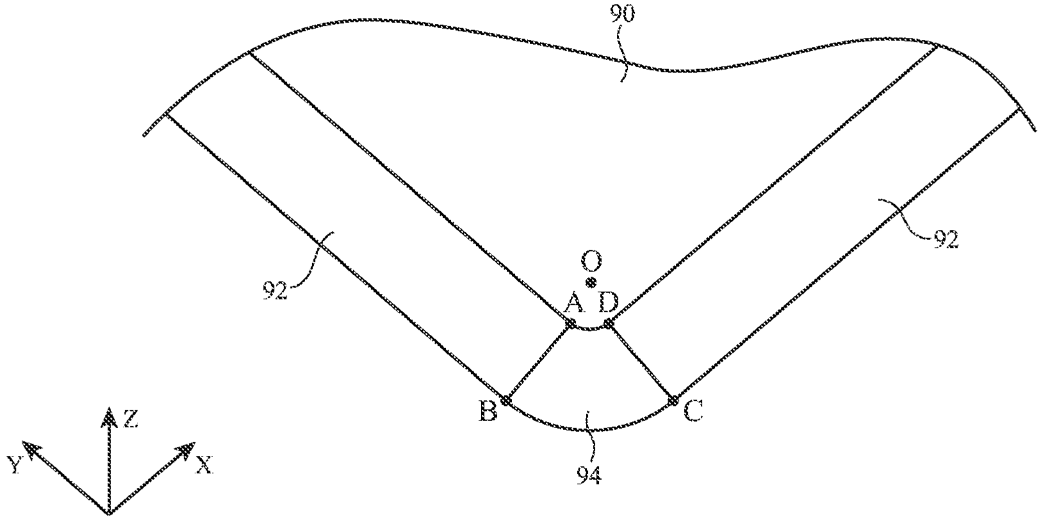
FIG. 9 is a perspective view of a flexible display panel before the flexible display panel is bent in accordance with an embodiment.

FIG. 9 is a perspective view of the flexible display panel before bending occurs. As shown, the flexible display panel has a central portion 90 that will not be bent, edge portions 92 that will be bent around a single bend axis (but will not have compound curvature), and corner portion 94 that will be bent to have compound curvature. Edge portions 92 may extend in a ring around central portion 90 (e.g., around the periphery of the display) with an intervening corner portion 94 between each pair of adjacent, orthogonal edges.

FIG. 9 also shows point O on a central portion 90 of the flexible display panel, points A and D at the border between the central portion 90 (that is not bent) and the corner and edge regions 92/94 (that are bent), and points B and C at the edge of the panel at the border between the corner portion 94 and edge portions 92.

Figure 10:
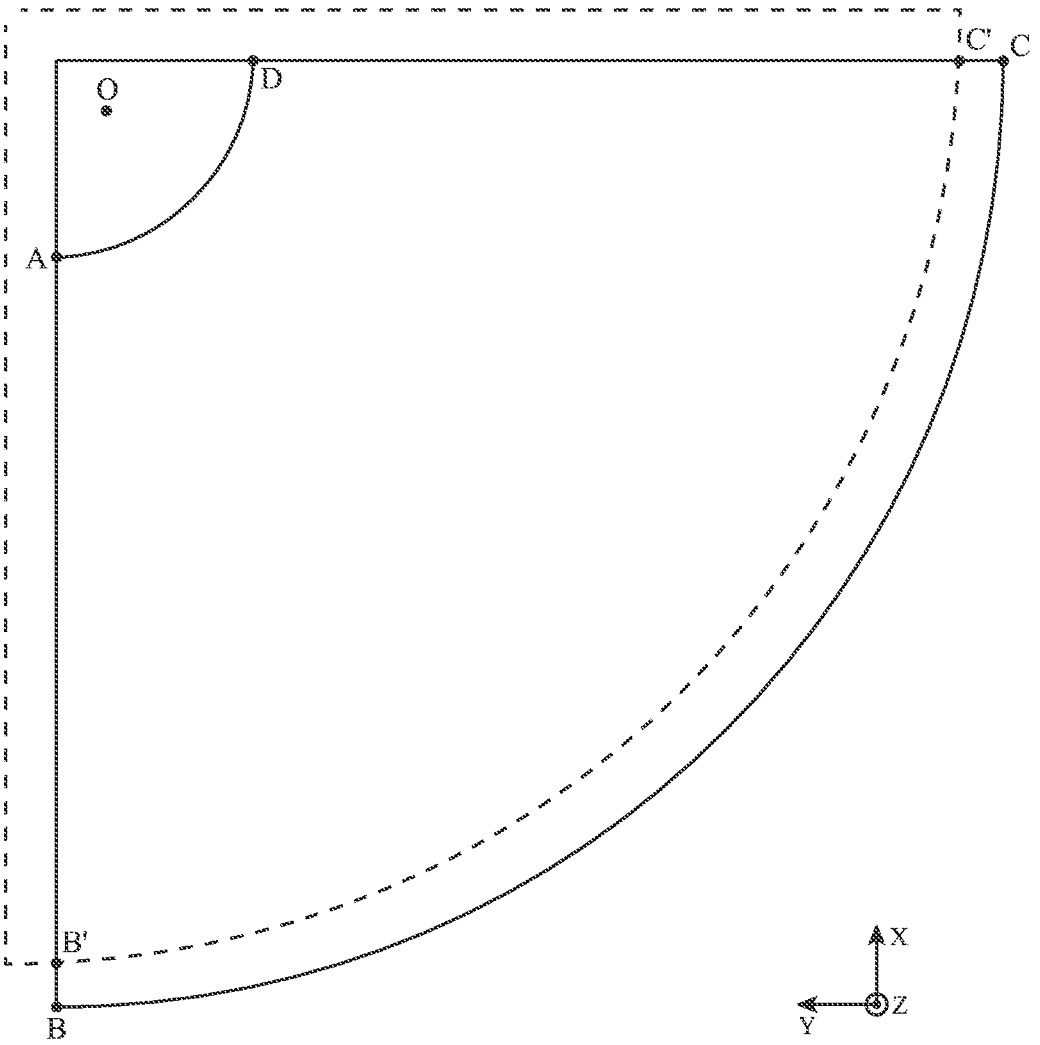
FIG. 10 is a top view of a corner region of a flexible display panel over a mold before the flexible display panel is bent in accordance with an embodiment.
Figure 11:
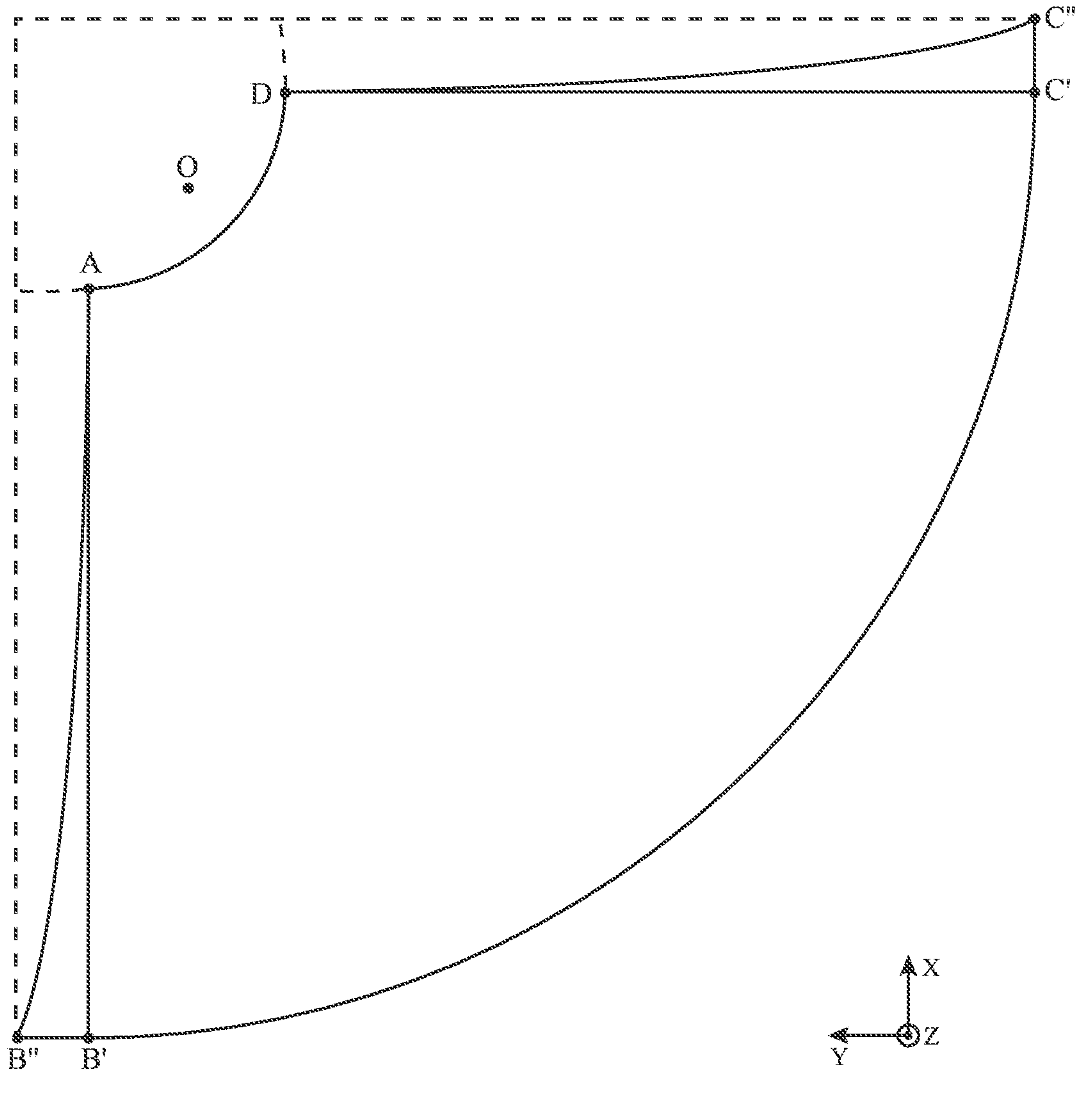
FIG. 11 is a top view of a corner region of a flexible display panel over a mold after the flexible display panel is bent in accordance with an embodiment.

FIG. 10 is a top view of flexible display panel 14 and mold 82 before the flexible display panel 14 is bent to conform to mold 82. FIG. 11 is a top view of flexible display panel 14 and mold 82 after the flexible display panel 14 is bent to conform to mold 82. As shown in FIG. 10, before the bending occurs, point B at the edge of the display panel is shifted outwards from point B' on the mold and point C at the edge of the display panel is shifted outwards from point C' on the mold. The flexible display panel has a rounded corner between points B and C.

During bending, the corner region of the flexible display panel (defined by points A, B, C, and D) is pressed adjacent to the mold to conform to the shape of the mold (which has compound curvature in the rounded corner region). As shown in FIG. 11, after the bending occurs, points A, O, and D (which are not bent) are unchanged. However, due to the geometry of the compound curved rounded corner, point B of the flexible display panel is shifted to point B" in FIG. 11 and point C of the flexible display panel is shifted to point C" in FIG. 11. As shown, points B" and C" are aligned with a smooth arc between points B' and C' on the mold. However, points B" and C" are shifted laterally relative to points B' and C'. This shift is an artifact of the extra material formed in the rounded corner region as a result of the bending. There is extra material between points A, B' and B" on one side of the rounded corner region and extra material between points D, C', and C" on the other side of the rounded corner region. This extra material causes compressive stress within the display panel, which may cause undesired wrinkling in the display panel.

It should also be noted that the amount of extra material in the rounded corner region is not uniform along the radial direction. Instead, the amount of extra material increases with increasing distance from the center of the display panel. Said another way, the amount of extra material is at a maximum at the edge of the display panel and decreases with increasing distance from the edge of the display panel.

There are various techniques that may be used to absorb compressive strain in the rounded corner region caused by compound curvature. In particular, a patterned backfilm may be used. The patterned backfilm may have different portions with different coefficients of thermal expansion, may have different portions with different elastic modulus magnitudes, and/or may be pre-stretched during manufacturing. The backfilm uses these properties/techniques to provide shrinkage that mitigates wrinkling and cracking in the display panel. These examples, however, are merely illustrative. If desired, the backfilm may instead or in addition provide shrinkage in any other form (e.g., thermal shrinkage or chemical shrinkage during curing) to mitigate wrinkling and cracking of the display panel.

Figure 12A:
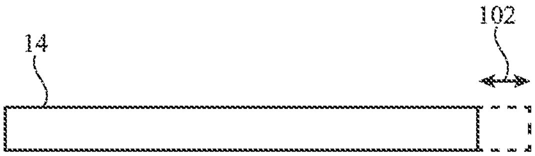
FIG. 12A is a cross-sectional side view of a flexible display panel shrinking during cooling in accordance with an embodiment.
Figure 12B:
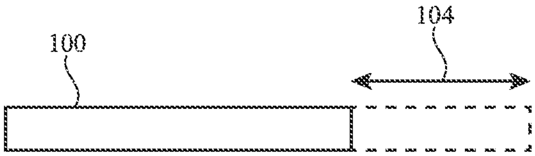
FIG. 12B is a cross-sectional side view of a backfilm shrinking during cooling in accordance with an embodiment.
Figure 12C:
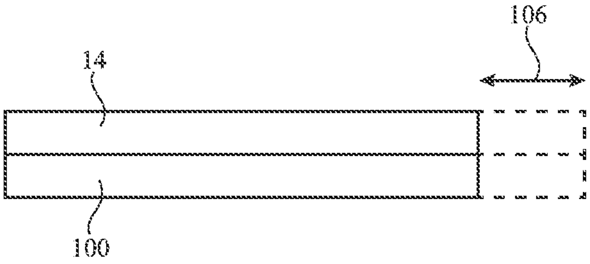
FIG. 12C is a cross-sectional side view of a flexible display panel and backfilm combination shrinking during cooling in accordance with an embodiment.

A mismatch between the coefficient of thermal expansion (CTE) of the backfilm and the flexible display panel may be used to absorb extra panel material after the three-dimensional lamination process (e.g., the bending process) and mitigate wrinkling. FIGS. 12A-12C illustrate the principle of leveraging CTE mismatch to mitigate wrinkling in the flexible display panel.

FIG. 12A is a cross-sectional side view of a flexible display panel 14. The dashed outline illustrates the length of the flexible display panel at a first time and at a first temperature ($T_1$). The flexible display panel may subsequently be cooled to a second temperature (T2) that is lower than the first temperature, resulting in the flexible display panel having the solid outline. When cooled, the flexible display shrinks according to the formula $\Delta L = \lambda \times \Delta T \times L0$, where ΔL is the change in length, λ is the coefficient of thermal expansion, ΔT is the change in temperature, and L0 is the original length. FIG. 12A shows a ΔL of 102 for the flexible display panel. In other words, the flexible display panel shrinks by distance 102 when cooled.

FIG. 12B, meanwhile, is a cross-sectional side view of a backfilm 100 (sometimes referred to as backing film 100, patterned film 100, film 100, etc.). The dashed outline illustrates the length of the backfilm at a first time and at a first temperature ($T_1$). The backfilm may subsequently be cooled to a second temperature (T2) that is lower than the first temperature, resulting in the backfilm having the solid outline. Again, when cooled, the backfilm shrinks according to the formula $\Delta L = \lambda \times \Delta T \times L0$, where ΔL is the change in length, λ is the coefficient of thermal expansion, ΔT is the change in temperature, and L0 is the original length. FIG. 12B shows a ΔL of 104 for the backfilm. In other words, the backfilm shrinks by distance 104 when cooled. The backfilm 100 may have a greater coefficient of thermal expansion than display panel 14. Therefore, with all other conditions (e.g., temperature and starting length) being the same, the backfilm shrinks by a greater amount than the display panel (e.g., distance 104 is greater than distance 102).

FIG. 12C is a cross-sectional side view of a backfilm 100 that is attached to a display panel 14. The dashed outline illustrates the length of the display panel and the backfilm at a first time and at a first temperature ($T_1$). The display panel and the backfilm may subsequently be cooled to a second temperature (T2) that is lower than the first temperature, resulting in the display panel and the backfilm having the solid outline. When cooled, the display panel and the backfilm both shrink according to the formula $\Delta L = \lambda \times \Delta T \times L0$, where ΔL is the change in length, λ is the effective coefficient of thermal expansion for the display/backfilm combination, ΔT is the change in temperature, and L0 is the original length. The effective CTE ($\lambda_{EFF}$) for the display/backfilm combination is determined according to the formula $\lambda_{EFF} = (E1 \times t1 \times \lambda 1 + E2 \times t2 \times \lambda 2)/(E1 \times t1 + E2 \times t2)$, where E1 and E2 are the Young's modulus of the display panel and backfilm, respectively, t1 and t2 are the thicknesses of the display panel and backfilm, respectively, and $\lambda_1$ and $\lambda_2$ are the CTEs of the display panel and backfilm, respectively. Increasing the thickness, CTE, and Young's modulus of the backfilm relative to the display panel may therefore increase the distance 106 that the display/backfilm combination shrinks when cooled. FIG. 12C shows an example where the display/backfilm combination shrinks by distance 106 (that is greater than distance 102 when the display is not attached to the backfilm).

Figure 12D:
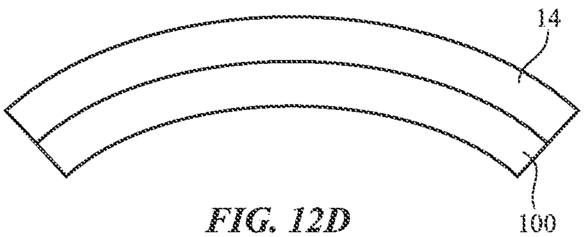
FIG. 12D is a cross-sectional side view showing how a flexible display panel and backfilm combination may curve during cooling in accordance with an embodiment.

The mismatch between CTEs of the display panel and the backfilm may also be used to induce bending in curved portions of the display. FIG. 12D shows how, when there is a CTE mismatch between display panel 14 and backfilm 100, the panel/backfilm combination may have curvature after being attached at a high temperature and then cooled to a lower temperature. This phenomenon may be used to help control the radius of curvature of the flexible display panel.

Figure 13:
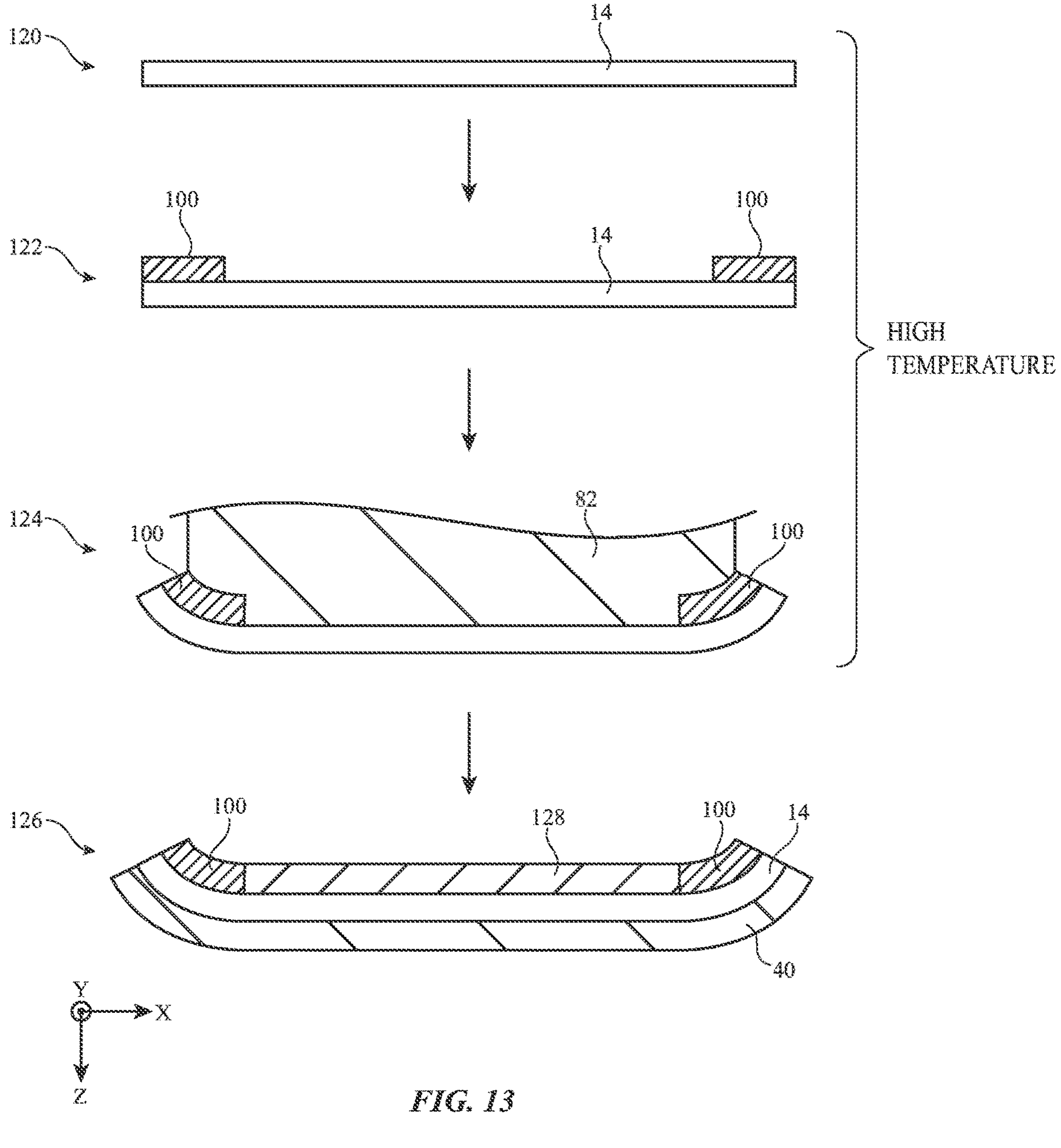
FIG. 13 is a cross-sectional side view of a flexible display panel during a molding process in accordance with an embodiment.

FIG. 13 is a cross-sectional side view of a flexible display panel during a bending process showing how a patterned backfilm may be used to mitigate wrinkling in the flexible display panel. At step 120, a flexible display panel 14 is provided. This flexible display panel is subsequently attached to a patterned backfilm 100 at step 122. The patterned backfilm may have a coefficient of thermal expansion that is greater than the coefficient of thermal expansion of the flexible display panel. As shown in FIG. 13, the flexible display panel may be attached to the patterned backfilm at a high temperature (e.g., greater than 80 degrees Fahrenheit, greater than 100 degrees Fahrenheit, greater than 150 degrees Fahrenheit, greater than 200 degrees Fahrenheit, greater than 300 degrees Fahrenheit, less than 300 degrees Fahrenheit, less than 250 degrees Fahrenheit, less than 200 degrees Fahrenheit, between 100 degrees Fahrenheit and 300 degrees Fahrenheit, etc.).

While at the high temperature, the flexible display panel and patterned backfilm may be bent to have desired curvature at step 124. A mold 82 may be pressed in the positive Z-direction (and/or the flexible display panel may be moved in the negative Z-direction) to cause the flexible display panel 14 and backfilm 100 to conform to the shape of the mold. Mold 82 may have compound curvature in the corner regions. Mold 82 may optionally have recesses to receive patterned backfilm 100 (in instances where backfilm 100 does not have a uniform thickness across the entire flexible display panel).

After the flexible display panel (with the attached backfilm) is molded to the desired shape at a high temperature, flexible display panel 14 may have wrinkles present from excess material in the rounded corner region (as shown in FIG. 11, for example). However, at step 126, the flexible display panel and backfilm are cooled to a second temperature that is lower than the temperature of steps 120-124. The cooled temperature may be room temperature, for example. While cooled, the backfilm 100 contracts by a greater amount than flexible display panel 14. The presence of backfilm 100 may therefore counteract the compressive strain caused by the extra material in the rounded corner region of the flexible display panel, removing the wrinkles in the flexible display panel.

Also at step 126, the flexible display panel may optionally be laminated to a display cover layer 40. Additionally, a planarization layer 128 (sometimes referred to as filler 128, dielectric layer 128, etc.) may be added to fill one or more gaps in patterned backfilm 100. After the planarization layer 128 is added, the backfilm 100 and planarization layer 128 may combine to form a single layer having a uniform thickness. The flexible display panel 14 is configured to emit light in the positive Z-direction through display cover layer 40 (and away from backfilm 100).

Display cover layer 40, flexible display panel 14, and backfilm 100 may each have four edges that are bent along a single axis (e.g., not compound curvature) and four corner regions having compound curvature, with each corner region being interposed between two adjacent edges. Each layer of display cover layer 40, flexible display panel 14, and backfilm 100 may have the same curvature (e.g., the layers may be conformal).

Figure 14:
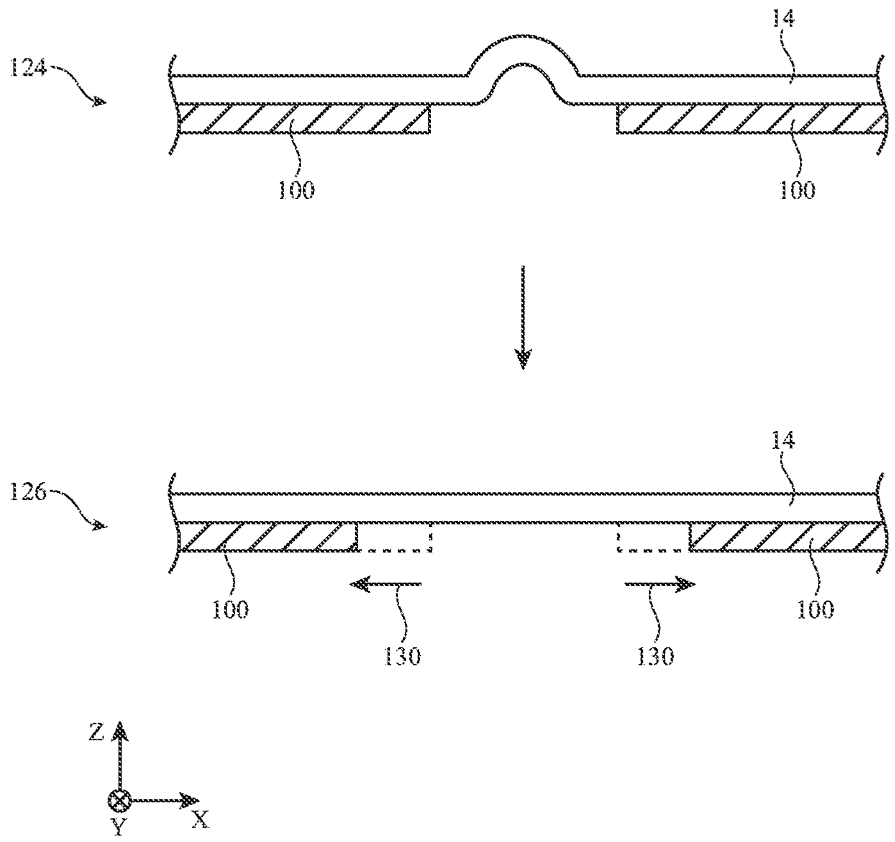
FIG. 14 is a cross-sectional side view of a flexible display panel showing how wrinkles may be removed by a backfilm during cooling in accordance with an embodiment.

FIG. 14 is a cross-sectional side view showing how, at step 124, there may be a wrinkle present in the flexible display panel between portions of the display that are coupled to portions of patterned backfilm 100. Then, at step 126, reducing the temperature causes the backfilm 100 to contract (by a greater amount than the flexible display panel) and pull the flexible display panel in directions 130, thereby causing the wrinkle in the flexible display panel to be removed.

It should be noted that the illustrative process for bending the flexible display panel (while mitigating wrinkling using a patterned backfilm) is merely illustrative. In general, there are many additional options that may be used during manufacturing. For example, a second mold (that is softer than the first mold) may also be pressed into the flexible display panel and patterned backfilm to ensure that all portions of the flexible display panel are fully attached to the display cover layer. Instead of adding a planarization layer 128 to fill gaps between the patterned backfilm, the patterned backfilm may optionally be removed entirely once the flexible display panel has desired curvature and has cooled to room temperature. The flexible display panel may be positioned on a sacrificial substrate for various parts of the molding/bending process. The flexible display panel and patterned backfilm may be molded while cooling such that any display wrinkling is absorbed by the backing film in real time.

Additionally, the example of the backfilm 100 having a higher coefficient of thermal expansion than the flexible display panel and mitigating wrinkling during cooling is merely illustrative. If desired, an inverse arrangement may be used, where the backfilm 100 has a lower coefficient of thermal expansion than the flexible display panel, the backfilm and display are attached at a first, low temperature, and wrinkling is mitigated when the display and backfilm are heated to a second, higher temperature.

Figure 15:
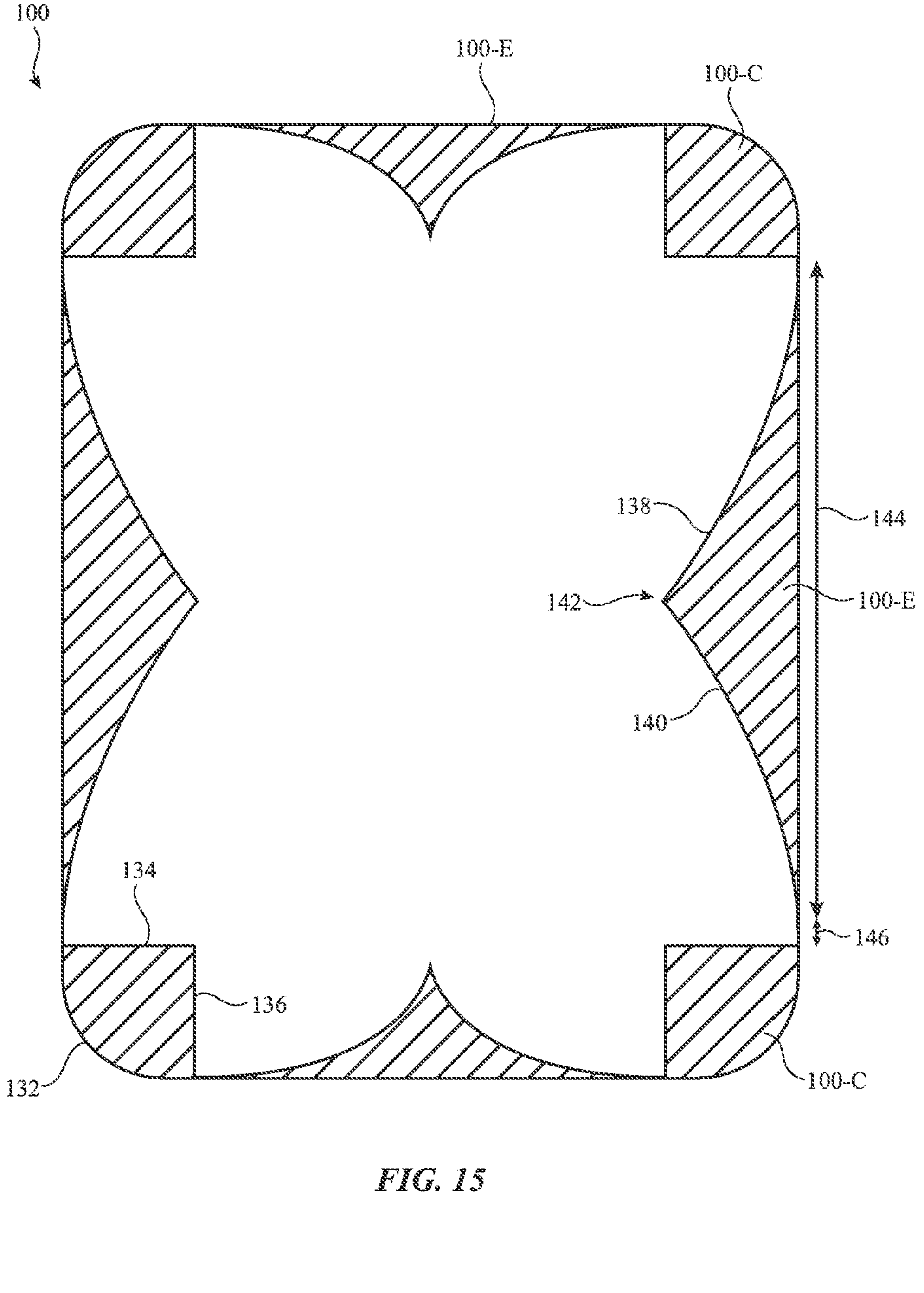
FIG. 15 is a top view of an illustrative patterned backfilm having corner portions and edge portions with two curved surfaces in accordance with an embodiment.

There are many possible arrangements for the shapes of patterned backfilm 100. FIG. 15 is a top view of patterned backfilm 100 that has corner portions 100-C and edge portions 100-E. The flexible display panel 14 may have a footprint 132 that is rectangular with rounded corners. Backfilm 100 has portions that match the footprint of the flexible display panel. The patterned backfilm 100 has a corner region 100-C in each of the four corners of the footprint. Each corner region 100-C has first and second orthogonal edges 134 and 136 and a curved surface (e.g., rounded corner) between the first and second orthogonal edges. The curved surface may match the outline of the footprint of the flexible display panel.

The patterned backfilm also includes four edge portions 100-E. Each edge portion 100-E is disposed along an edge of the footprint of the display between two respective corner portions 100-C. Each edge portion has curved surfaces 138 and 140 that meet at a vertex 142. Curved surfaces 138 and 140 may have, for example concave curvature.

With the pattern of FIG. 15, edge portions 100-E have an increasing amount of material with increasing distance from the center of the display panel. In other words, the width 144 of the backfilm material in edge portion 100-E is at a minimum at vertex 142 (closest to the center of the display panel) and is at a maximum at the edge of the footprint of the display panel. The width therefore gradually increases with increasing distance from the center of the display panel. This matches the profile of the extra material in the flexible display panel caused by the three-dimensional bending (as shown in FIG. 11) and therefore effectively mitigates wrinkling from the extra material.

There may be a gap 146 between each corner portion 100-C and edge portion 100-E of the backfilm. The gap 146 may be approximately the location where wrinkling occurs in the flexible display panel. Therefore, when the backfilm pulls the flexible display panel due to coefficient of thermal expansion mismatch, the wrinkling in gap 146 may be eliminated.

Including both corner portions 100-C and edge portions 100-E in the backfilm is merely illustrative. If desired, corner portions 100-C may be omitted and only edge portions 100-E may be included. Similarly, edge portions 100-E may be omitted and only corner portions 100-C may be included.

Figure 16:
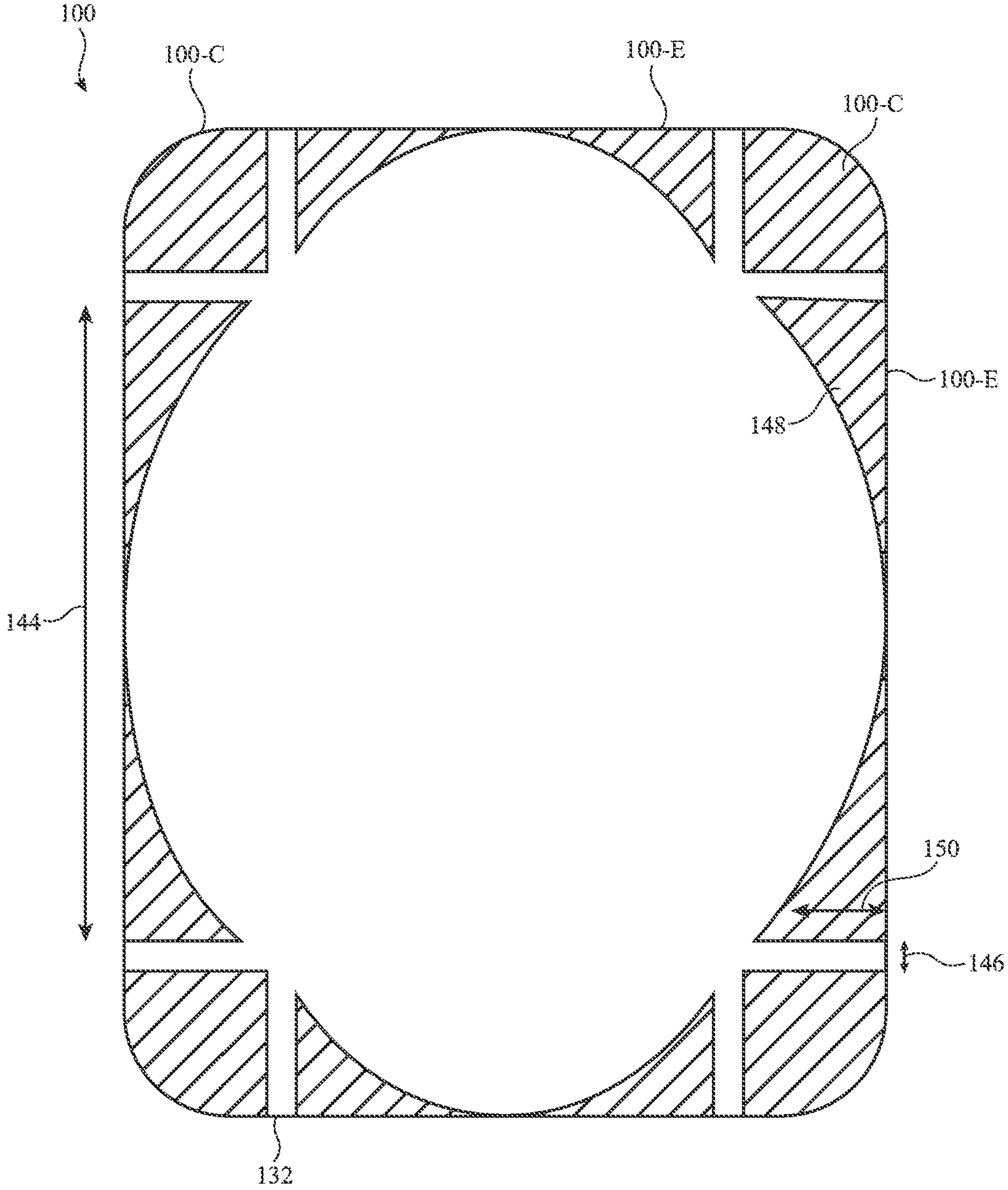
FIG. 16 is a top view of an illustrative patterned backfilm having corner portions and edge portions with one curved surface in accordance with an embodiment.

FIG. 16 is a top view of another possible arrangement for backfilm 100. As shown, the backfilm may include four corner portions 100-C (having the same arrangement as in FIG. 15). However, edge portions 100-E in FIG. 16 have a different arrangement than in FIG. 15. In FIG. 16, each edge portion 100-E has a concave curved surface 148. In FIG. 15, the edge portions 100-E have a maximum thickness 150 at the center of the edge portion and minimum thicknesses at the edges of the edge portion. In contrast, in FIG. 16, the edge portions 100-E have a maximum thickness 150 at the edges of the edge portion and a minimum thickness at the center of the edge portion. Concave curved surface 148 may be a single continuous curved surface or may be two concave curved surfaces that meet at the center of the edge portion.

Similar to the pattern of FIG. 15, edge portions 100-E in FIG. 16 have an increasing amount of material with increasing distance from the center of the display panel. In other words, the width 144 of the backfilm material in edge portion 100-E is at a minimum closer to the center of the display panel and is at a maximum at the edges of the footprint of the display panel. The width therefore gradually increases with increasing distance from the center of the display panel. This matches the profile of the extra material in the flexible display panel caused by the three-dimensional bending (as shown in FIG. 11) and therefore effectively mitigates wrinkling from the extra material.

There may be a gap 146 between each corner portion 100-C and edge portion 100-E of the backfilm in FIG. 16. The gap 146 may be approximately the location where wrinkling occurs in the flexible display panel. Therefore, when the backfilm pulls the flexible display panel due to coefficient of thermal expansion mismatch, the wrinkling in gap 146 may be eliminated.

Including both corner portions 100-C and edge portions 100-E in the backfilm of FIG. 16 is merely illustrative. If desired, corner portions 100-C may be omitted and only edge portions 100-E may be included. Similarly, edge portions 100-E may be omitted and only corner portions 100-C may be included.

Figure 17:
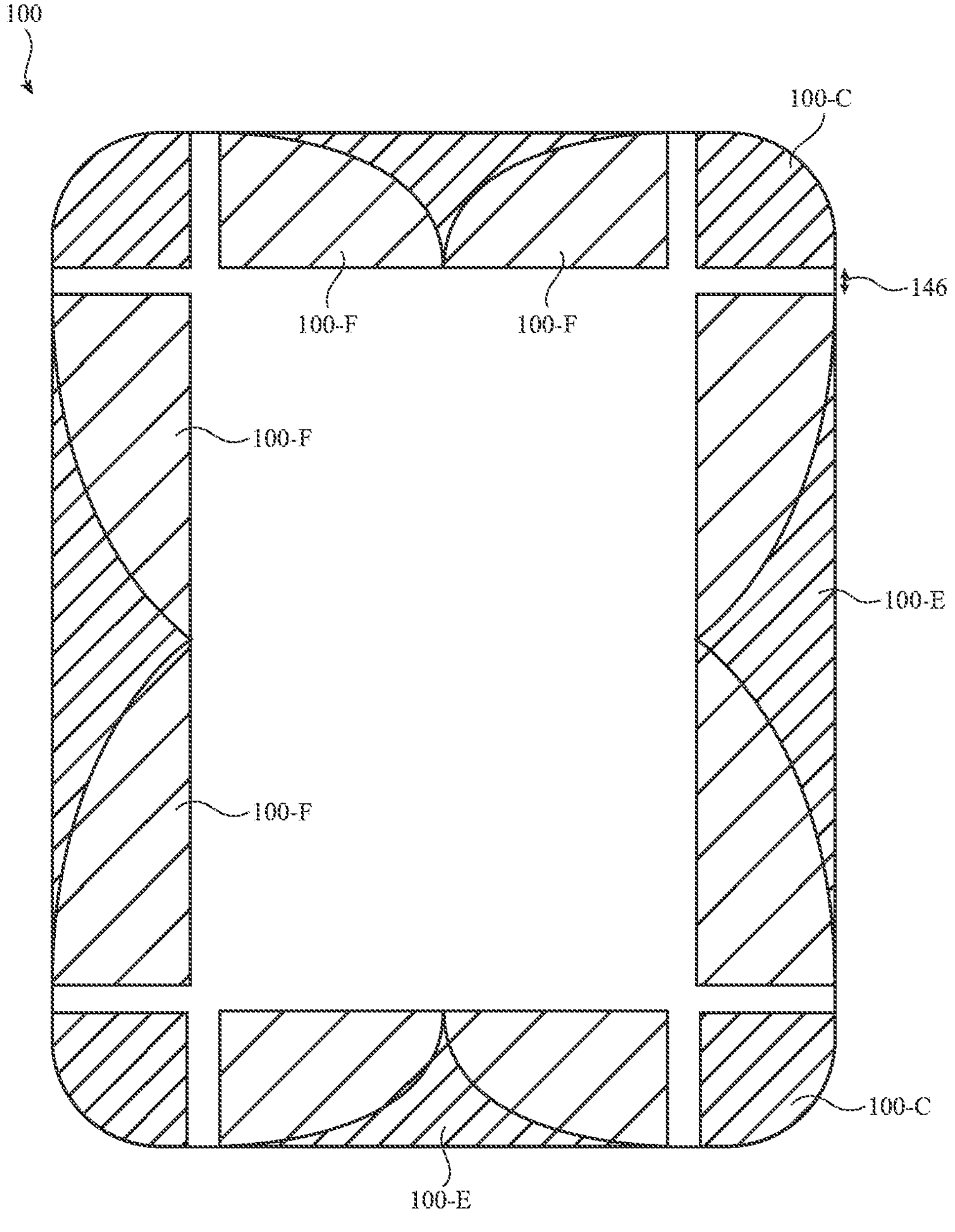
FIG. 17 is a top view of an illustrative patterned backfilm having corner portions, edge portions with two curved surfaces, and filler portions with a lower coefficient of thermal expansion in accordance with an embodiment.

In FIGS. 15 and 16, backfilm 100 includes one homogenous material that has a uniform coefficient of thermal expansion across the footprint of the backfilm. This example is merely illustrative. In another possible arrangement, the backfilm may include two materials having two different thermal coefficients of expansion. FIG. 17 is a top view of an illustrative backfilm with two different materials. As shown, the backfilm may include portions 100-C and 100-E having the same arrangement as in FIG. 15. The same material may be used to form portions 100-C and 100-E. The material for portions 100-C and 100-E may have a different (e.g., higher) coefficient of thermal expansion than the flexible display panel to which the backfilm is attached.

In addition to portions 100-C and 100-E, the backfilm includes portions 100-F formed form a different material than portions 100-C and 100-E. The second material (used to form portions 100-F) may have the same coefficient of thermal expansion as the flexible display panel. Portions 100-F may conform to portions 100-E along each edge of the backfilm. The portions 100-F therefore essentially follow an inverse profile than portions 100-E. In other words, portions 100-F have a maximum width closer to the center of the display and a minimum width at the edge of the display. Along each edge of the display, a portion 100-E and portion 100-F may combine to form a rectangular footprint.

Including corner portions 100-C, edge portions 100-E, and filler portions 100-F in the backfilm of FIG. 17 is merely illustrative. If desired, corner portions 100-C may be omitted and only edge portions 100-E and filler portions 100-F may be included. Similarly, edge portions 100-E may be omitted and only corner portions 100-C and filler portions 100-F may be included. In this type of arrangement (where edge portions 100-E having a high CTE are omitted), each filler portion 100-F may optionally have a rectangular footprint (e.g., matching the footprint of what is instead the 100-E/100-F combination in FIG. 17).

Figure 18:
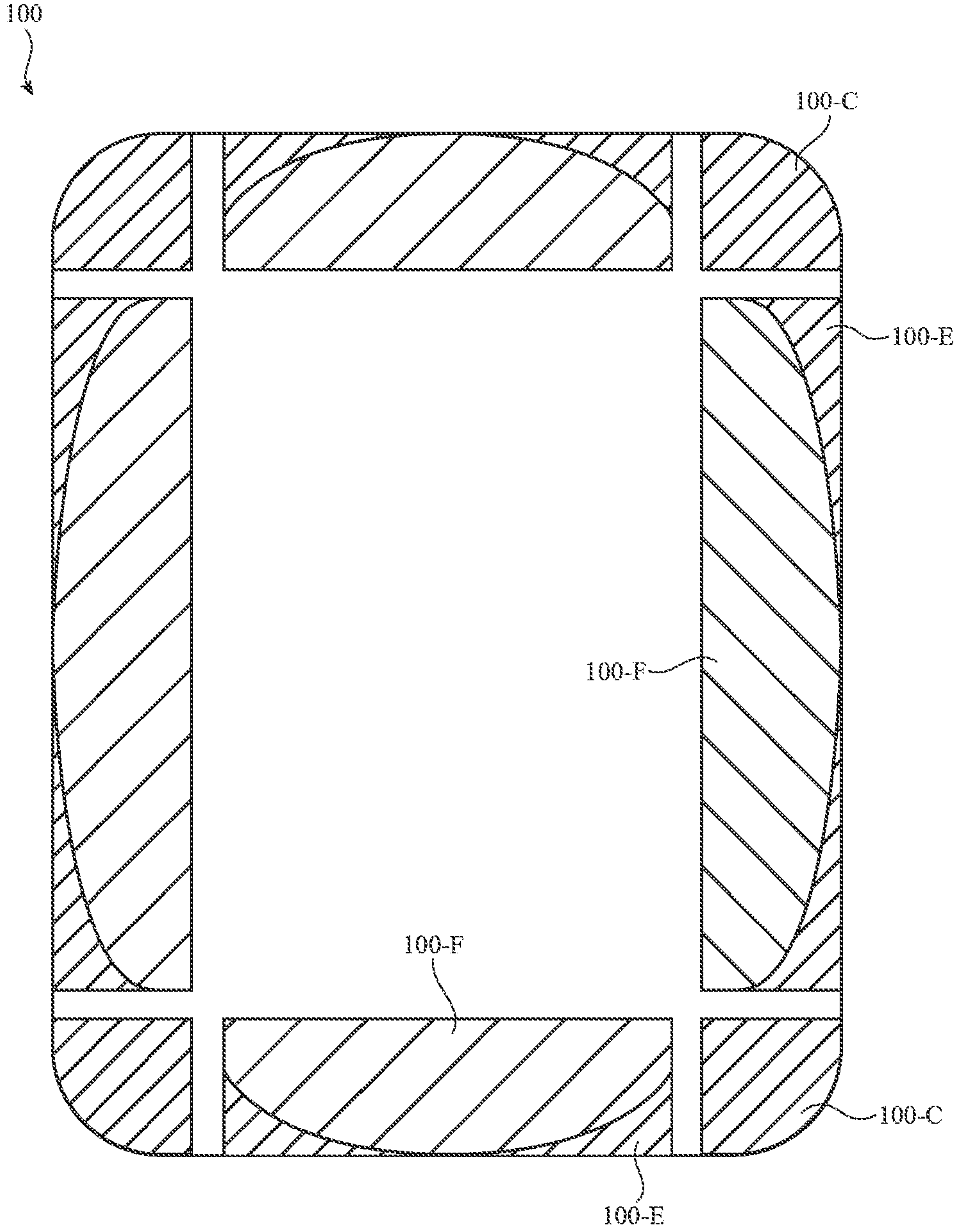
FIG. 18 is a top view of an illustrative patterned backfilm having corner portions, edge portions with one curved surface, and filler portions with a lower coefficient of thermal expansion in accordance with an embodiment.

FIG. 18 is a top view of another illustrative backfilm with two different materials. As shown, the backfilm may include portions 100-C and 100-E having the same arrangement as in FIG. 16. The material used to form portions 100-C and 100-E may have a different (e.g., higher) coefficient of thermal expansion than the flexible display panel to which the backfilm is attached.

In addition to portions 100-C and 100-E, the backfilm includes portions 100-F formed form a different material than portions 100-C and 100-E. The second material (used to form portions 100-F) may have the same coefficient of thermal expansion as the flexible display panel. Portions 100-F may conform to portions 100-E along each edge of the backfilm. The portions 100-F therefore essentially follow an inverse profile than portions 100-E. In other words, portions 100-F have a maximum width closer to the center of the display and a minimum width at the edge of the display. Along each edge of the display, a portion 100-E and portion 100-F may combine to form a rectangular footprint.

Including corner portions 100-C, edge portions 100-E, and filler portions 100-F in the backfilm of FIG. 18 is merely illustrative. If desired, corner portions 100-C may be omitted and only edge portions 100-E and filler portions 100-F may be included. Similarly, edge portions 100-E may be omitted and only corner portions 100-C and filler portions 100-F may be included. In this type of arrangement (where edge portions 100-E having a high CTE are omitted), each filler portion 100-F may optionally have a rectangular footprint (e.g., matching the footprint of what is instead the 100-E/100-F combination in FIG. 18).

In FIGS. 17 and 18, a filler portion 100-F may also fill the middle of the backfilm (e.g., such that a single contiguous filler portion 100-F conforms to all of the edge portions 100-E and covers the central part of the flexible display panel). In this type of arrangement, the only gaps that are not covered by a portion of the backfilm are the gaps adjacent to each orthogonal edge of each corner portion. Alternatively, the corner portions may be omitted and the corner regions are the only regions not covered by a portion of the backfilm.

In FIGS. 15-18, each material used to form at least a portion of the backfilm is homogenous (e.g., the coefficient of thermal expansion is the same across the footprint of the backfilm). This example is merely illustrative. In another possible arrangement, shown in FIG. 19, one or more materials within the backing film may have a location-dependent coefficient of thermal expansion and/or an anisotropic coefficient of thermal expansion.

Figure 19:
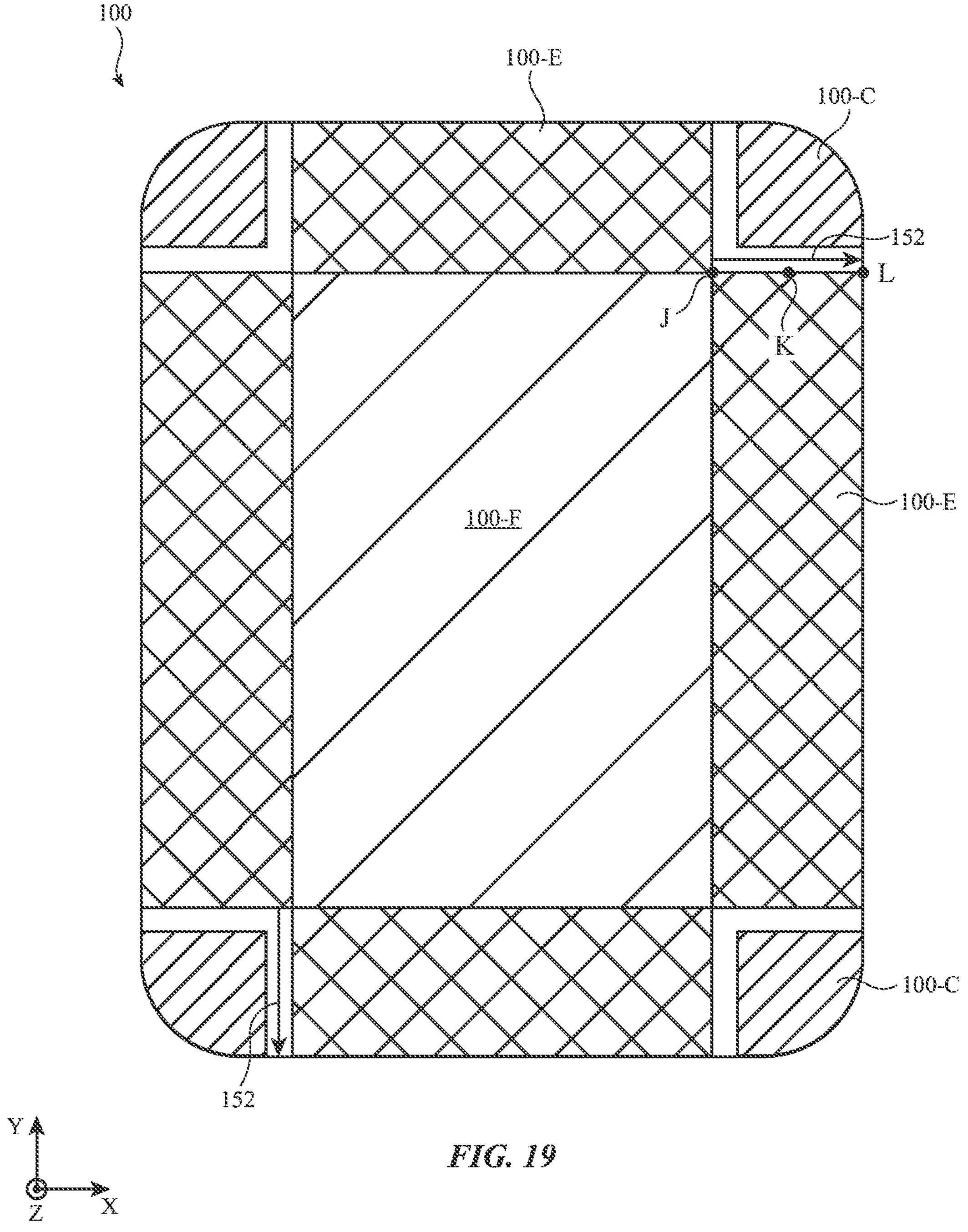
FIG. 19 is a top view of an illustrative patterned backfilm having edge portions with a coefficient of thermal expansion gradient in accordance with an embodiment.

FIG. 19 is a top view of an illustrative backfilm with a portion that has a coefficient of thermal expansion gradient. As shown, the backfilm of FIG. 19 may include four corner portions 100-C (having the same arrangement as in FIGS. 15-18). Corner portions 100-C have a higher coefficient of thermal expansion than the coefficient of thermal expansion for the display panel. Corner portions 100-C may have a uniform coefficient of thermal expansion.

The backfilm also includes edge portions 100-E that have a varying coefficient of thermal expansion. As one example, the edge portions 100-E may have a CTE gradient such that that CTE gradually changes across the edge portion. As shown in FIG. 19, the CTE of edge portion 100-E may increase outwardly from the center of the display panel (e.g., in direction 152). With this type of arrangement, the edge portion 100-E may have a first CTE at point J (that is closest to the center of the display along the X-axis), a second CTE that is greater than the first CTE at point K (which is shifted further from the center of the display along the X-axis), and a third CTE that is greater than the second CTE at point L (which is shifted further from the center of the display along the X-axis). Each edge portion 100-E may have a similar CTE gradient that increases along one of the dimensions (e.g., the shorter dimension of the rectangular portion) of the edge portion's footprint. Each edge portion 100-E has a first side (e.g., a center-side interface) that is adjacent to the central portion of the flexible display panel and a second side that is adjacent to the outline of the footprint of the flexible display panel. The CTE may increase from the first side to the second side of each edge portion 100-E.

Figure 20:
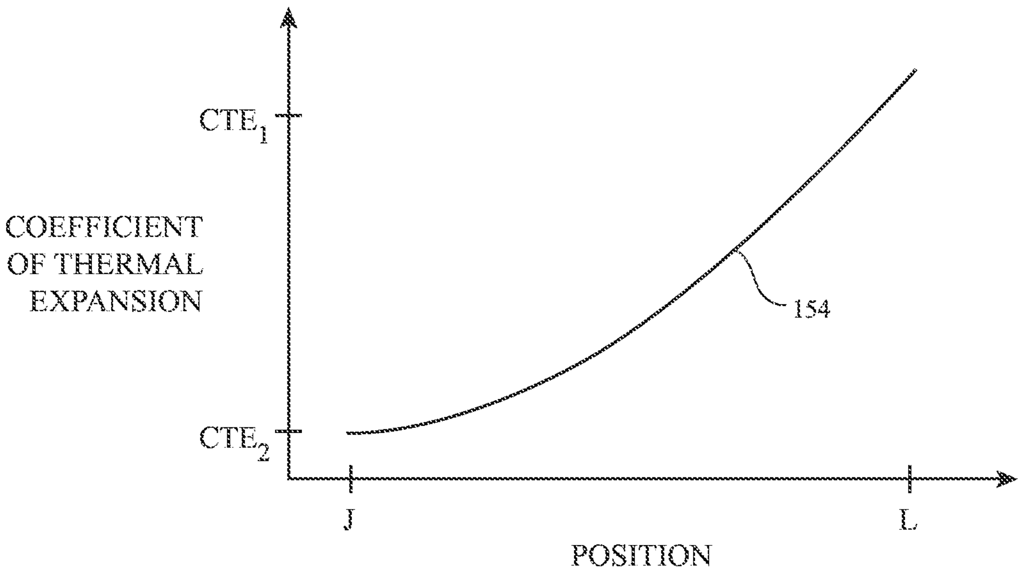
FIG. 20 is a graph of coefficient of thermal expansion as a function of position for an edge portion of a patterned backfilm in accordance with an embodiment.

FIG. 20 is a graph of the coefficient of thermal expansion of edge portion 100-E of the backfilm as a function of position. As shown, at point J (e.g., closest to the middle of the flexible display panel), the CTE may be at a minimum value $CTE_2$. The CTE increases as the position moves further away from the middle of the flexible display panel. At point L (at the edge of the flexible display panel), the CTE has a maximum value $CTE_1$ that is greater than $CTE_2$. This causes the backfilm to apply more pulling force to the flexible display panel at the edges of the flexible display panel, where the amount of excess display panel material is also at a maximum.

Including corner portions 100-C, edge portions 100-E, and filler portions 100-F in the backfilm of FIG. 19 is merely illustrative. If desired, corner portions 100-C and/or filler portion 100-F may be omitted.

The example in FIG. 19 of the CTE following a gradient in edge portions 100-E is merely illustrative. In general, the CTE may follow a gradient in any desired portion of the backfilm (e.g., a similar pattern with increasing CTE at increasing distances from the center of the display panel may be followed in corner portions 100-C). Instead or in addition to having a CTE gradient, one or more of the portions of the backfilm may have an anisotropic CTE. In these types of arrangements, the CTE of the material is different along one axis than along a second, orthogonal axis. This type of arrangement may be used to have a high CTE along only the axis that is desired for the backing film to apply force on the display panel. For example, the left and right edge portions 100-E in FIG. 19 may have a high CTE along the Y-axis and the same CTE as the flexible display panel along the X-axis. The top and bottom edge portions 100-E in FIG. 19 may have a high CTE along the X-axis and the same CTE as the flexible display panel along the Y-axis.

In the arrangements of FIGS. 15-19, the backing film may include one layer (of either one, two or three materials). Alternatively, different layers of material may be stacked vertically to form the backing film.

It should additionally be noted that the presence of gaps 146 (e.g., in FIGS. 15-19) around the corner portions 100-C are optional. If desired, the gaps may be omitted and material for the backing film may be formed without a gap around the periphery of the flexible display panel. As one example, a material with a higher coefficient of thermal expansion than the flexible display panel may be formed in a ring around the flexible display panel that has a uniform thickness 150 (e.g., the dimension from the edge of the footprint towards the middle of the display panel). Removing the gaps around the periphery of the backing film may mitigate stress caused by discontinuities in the backing film.

Various materials may be used to form the various portions of backing film 100. Backing film 100 may include polymers and elastomers such as ionomers, polytetrafluoroethylene (PTFE), polyethylene (PE), polypropylene (PP), acrylonitrile butadiene styrene (ABS), polystyrene (PS), polycarbonate (PC), polyether ether ketone (PEEK), phenolic resins, polyethylene terephthalate (PET), acetal, poly (methyl methacrylate) (PMMA), and epoxies. Other materials such as flexible polymer foams, silicones, polyurethane, rigid polymer foams, or any other desired material may be used.

Portions of the backing film intended to have a higher CTE than the display panel (e.g., portions 100-C and 100-E) may have a coefficient of thermal expansion (in units of $10^{-6}$/K) of greater than 10, greater than 50, greater than 100, greater than 200, greater than 400, less than 500, less than 400 less than 300, less than 200, less than 100, between 50 and 500, between 50 and 300, between 50 and 200, etc.

The examples in FIGS. 15-19 of the backfilm being patterned are merely illustrative. In another possible embodiment, the backfilm may be a uniform layer having the same footprint-shape as the flexible display panel (e.g., a rectangular shape with rounded corners). Shrinkage of a backfilm of this shape during cooling may effectively mitigate wrinkling and reduce strain within the display panel.

Instead of or in addition to using CTE mismatch, thermal shrinkage may be used to control wrinkling of the display panel during bending. Certain materials undergo shrinkage at high temperatures. The backfilm may be formed from a material that undergoes shrinkage at high temperatures (e.g., between 120 degrees Celsius and 170 degrees Celsius). The thermal-shrinkage material may have the same footprint-shape as the flexible display panel (rectangular with rounded corners) or may be patterned using any of the shapes shown in FIGS. 15-19. Optional filler material 100-F may also be included in addition to the thermal-shrinkage material in the backfilm.

Thermoplastic polyolefin materials such as polyethylene and polypropylene may be used for the thermal-shrinkage material. A backfilm of this type of material may undergo 20%-75% dimensional shrinkage when exposed to high temperatures (e.g., between 120 degrees Celsius and 170 degrees Celsius). During a manufacturing process that uses thermal-shrinkage material for the backfilm, the thermal-shrinkage material backfilm may first be attached to the backside of the display panel at room temperature. The display panel and backfilm may then be laminated to a three-dimensional bottom mold (e.g., with compound curvature in the corner regions). The temperature of the bottom mold may then be increased to activate shrinkage of the backfilm. The shrinkage of the backfilm helps the display panel stay in the desired three-dimensional shape with reduced stress on the panel. Finally, the panel and backfilm may be removed from the mold and the temperature of the panel and backfilm is lowered back to room temperature.

Instead of or in addition to using CTE mismatch or thermal shrinkage to control wrinkling of the display panel during bending, varying elastic modulus magnitudes and/or stretching of the backfilm may be used. The patterned backfilm may have different portions with different elastic modulus magnitudes. The patterned backfilm may also be stretched during the bending process.

Figure 21:
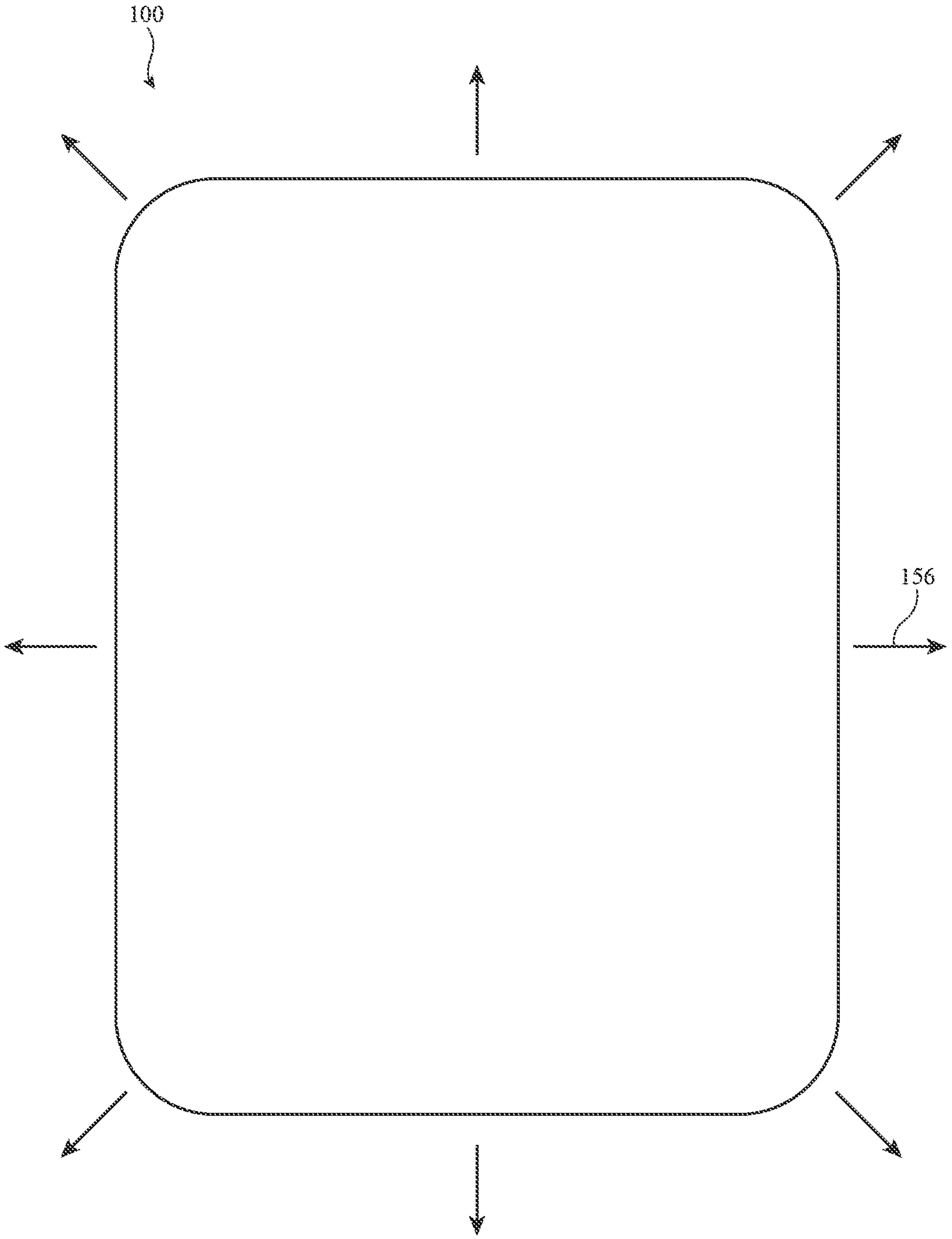
FIG. 21 is a top view of an illustrative backfilm showing how the backfilm may be stretched radially outwards away from the center of the backfilm in accordance with an embodiment.

FIG. 21 is a top view of an illustrative backfilm showing how the backfilm may be stretched. As shown in FIG. 21, the backfilm may be stretched radially outwards by applying force in directions 156. Because of Poisson's effect (where a material stretched in a first direction tends to becomes thinner in the orthogonal direction), the backfilm may apply force to the flexible display panel to mitigate wrinkling after the stretching force is released.

Figure 22:
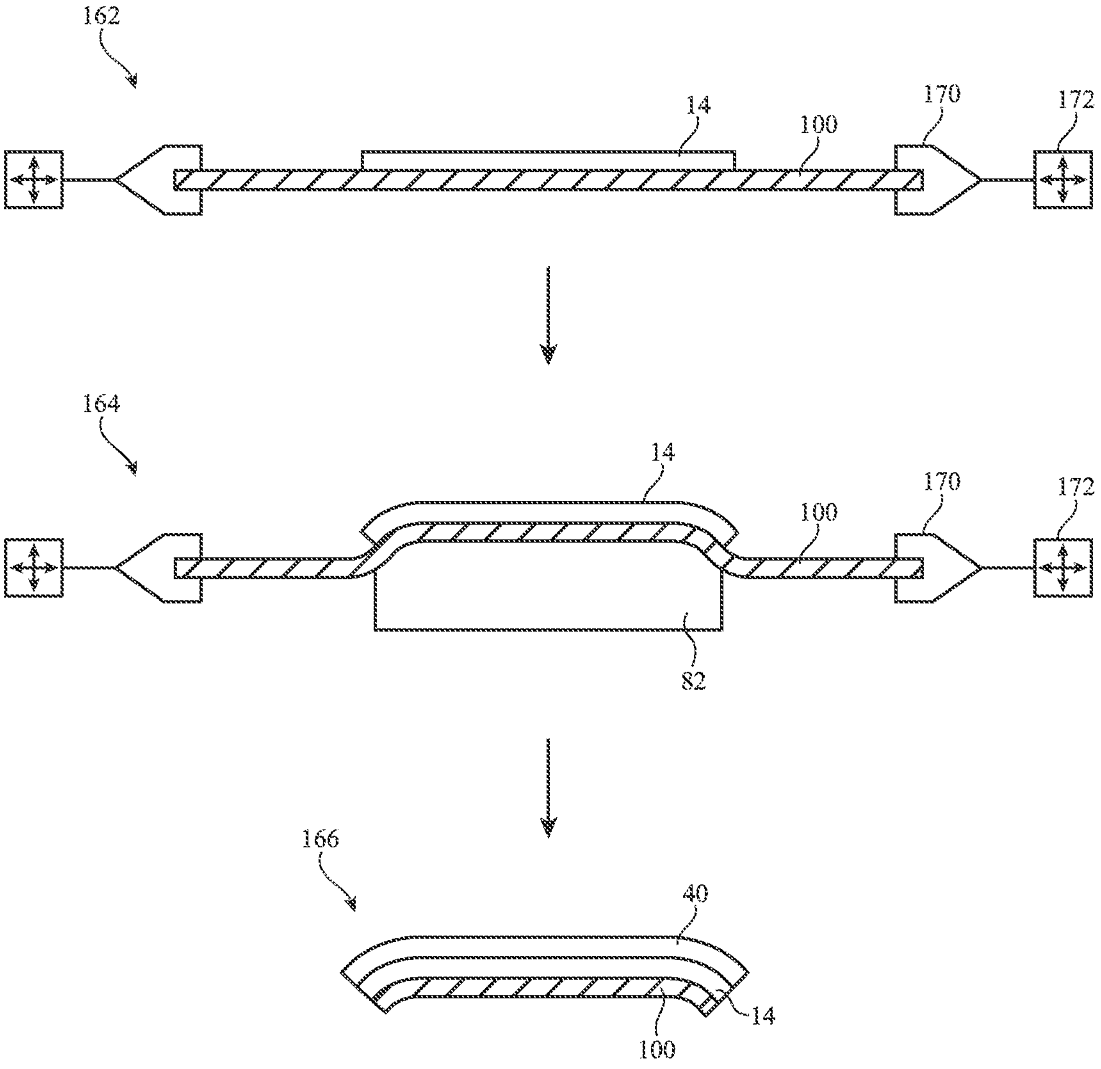
FIG. 22 is a cross-sectional side view of a flexible display panel during a molding process in which a backfilm is stretched in accordance with an embodiment.

FIG. 22 is a cross-sectional side view of a flexible display panel during a bending process showing how a backfilm may be stretched to mitigate wrinkling in the flexible display panel. At step 162, flexible display panel 14 is attached to a backfilm 100. Clamps 170 are attached to the edges of backfilm 100. The clamps 170 may be controlled by computer-controlled positioners 172, as an example. Next, at step 164, the flexible display panel 14 and backfilm 100 are pressed into mold 82 to conform to the surface of mold 82. Mold 82 may impart desired curvature (e.g., compound curvature in the corner regions) to flexible display panel 14. During the molding process, clamps 170 may pull backfilm 100 outwards radially (e.g., as shown in FIG. 21) to stretch the backfilm. Due to Poisson's effect, the backfilm shrinks in the transverse direction (e.g., orthogonal to the radial direction around the periphery of the backfilm) while stretched. As shown in FIG. 22, backfilm 100 may initially have a footprint that is larger than the footprint of display 14. This provides space for the backfilm to be clamped during the stretching process.

Subsequently, at step 166, the backfilm may be released from the clamps (e.g., is no longer stretched). This causes strain in the backfilm that mitigates wrinkling caused by extra display panel material in the corner region of the display. Also at step 166, a display cover layer 40 may be laminated to display panel 14 (e.g., using an optically clear adhesive). Additionally, excess material in the backfilm (e.g., material that extends past the footprint of the display panel) may be trimmed.

After step 166 is complete, display cover layer 40, flexible display panel 14, and backfilm 100 may each have four edges that are bent along a single axis (e.g., not compound curvature) and four corner regions having compound curvature, with each corner region being interposed between two adjacent edges. Each layer of display cover layer 40, flexible display panel 14, and backfilm 100 may have the same curvature (e.g., the layers may be conformal).

It should be noted that the illustrative process in FIG. 22 for bending the flexible display panel (while mitigating wrinkling using a stretched backfilm) is merely illustrative. In general, there are many additional options that may be used during manufacturing. The backfilm and flexible display panel may be heated during the molding/stretching steps. The higher temperature may make the materials easier to stretch, improving the ease of manufacturing. A second mold may be used in addition to mold 82 in FIG. 22. For example, the second mold may be pressed on flexible display panel 14 on an opposing side from mold 82 (e.g., the first and second molds are pressed together with the display panel and backfilm sandwiched in between). In FIG. 22, backfilm 100 may be stretched during the molding process. Alternatively, the backing film may be stretched before being attached to the flexible display panel (and therefore before the molding step). After the pre-stretched backing film is attached to the flexible display panel, the backing film may be released (e.g., is no longer stretched) and the display panel and backfilm combination may be molded.

Therefore, stretching a backfilm during the bending/molding process for the flexible display panel may mitigate wrinkling in the flexible display panel. In the arrangement of FIGS. 21 and 22, a homogenous backfilm having a uniform elastic modulus is used. With this type of backfilm, shrinkage in the backfilm caused by stretching may be uniform. However, as shown in FIG. 11, the amount of extra material of the flexible display panel induced by compound curvature in the corner region increases in the radial direction. When a homogenous backfilm is used, this mismatch (between the uniform force applied by the backfilm due to Poisson's effect and the non-uniform amount of extra material and corresponding strain in the flexible display panel) may result in a high concentration of tension strain in the corners of the flexible display panel.

Figure 23:
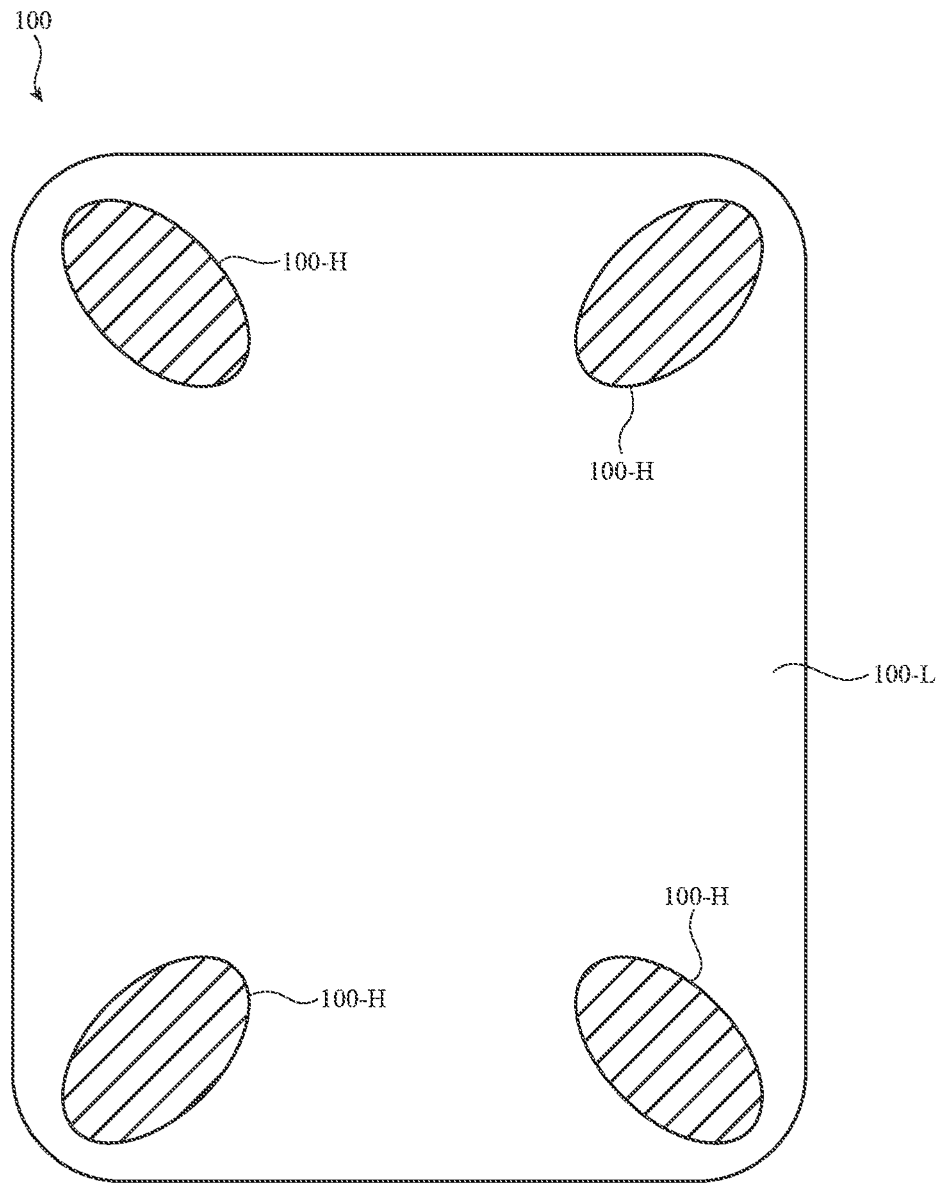
FIG. 23 is a top view of an illustrative backfilm that has high Young's modulus portions in each corner to reduce tension in the corners of the flexible display panel in accordance with an embodiment.

To combat the high-tension areas in the corner regions of the flexible display panel, the backfilm may be patterned to have portions with a high Young's modulus in the corner regions. FIG. 23 is a top view of an illustrative backfilm with discrete high Young's modulus portions in the corner regions. As shown, each respective corner of the backfilm has a respective high Young's modulus portion 100-H (sometimes referred to as high-rigidity portion 100-H, rigid portion 100-H, high Young's modulus patch 100-H, etc.). The remaining area of the backfilm 100-L has a low Young's modulus and therefore is sometimes referred to as low Young's modulus portion 100-L, low-rigidity portion 100-L, stretchable portion 100-L, flexible portion 100-L, etc. Portions 100-H have a higher Young's modulus than portion 100-L. Including these more rigid corner portions in the backfilm may reduce the tension strain in the corner region of the flexible display panel.

Each high Young's modulus portion 100-H of the backfilm may be a discrete patch (island) that is laterally surrounded by portion 100-L (e.g., when viewed from above). As shown by the cross-sectional side view of FIG. 24A, the backfilm may have a single-layer arrangement where high Young's modulus portions 100-H are coplanar with low Young's modulus portion 100-L. Alternatively, as shown by the cross-sectional side view of FIG. 24B, the backfilm may have a multi-layer arrangement where high Young's modulus portions 100-H are formed below low Young's modulus portion 100-L.

In FIG. 23, each portion 100-L and 100-H has a uniform Young's modulus. However, this example is merely illustrative. Another way to absorb non-uniform extra material in the corner region of the flexible display panel is to use a backfilm with a Young's modulus gradient.

Figure 25:
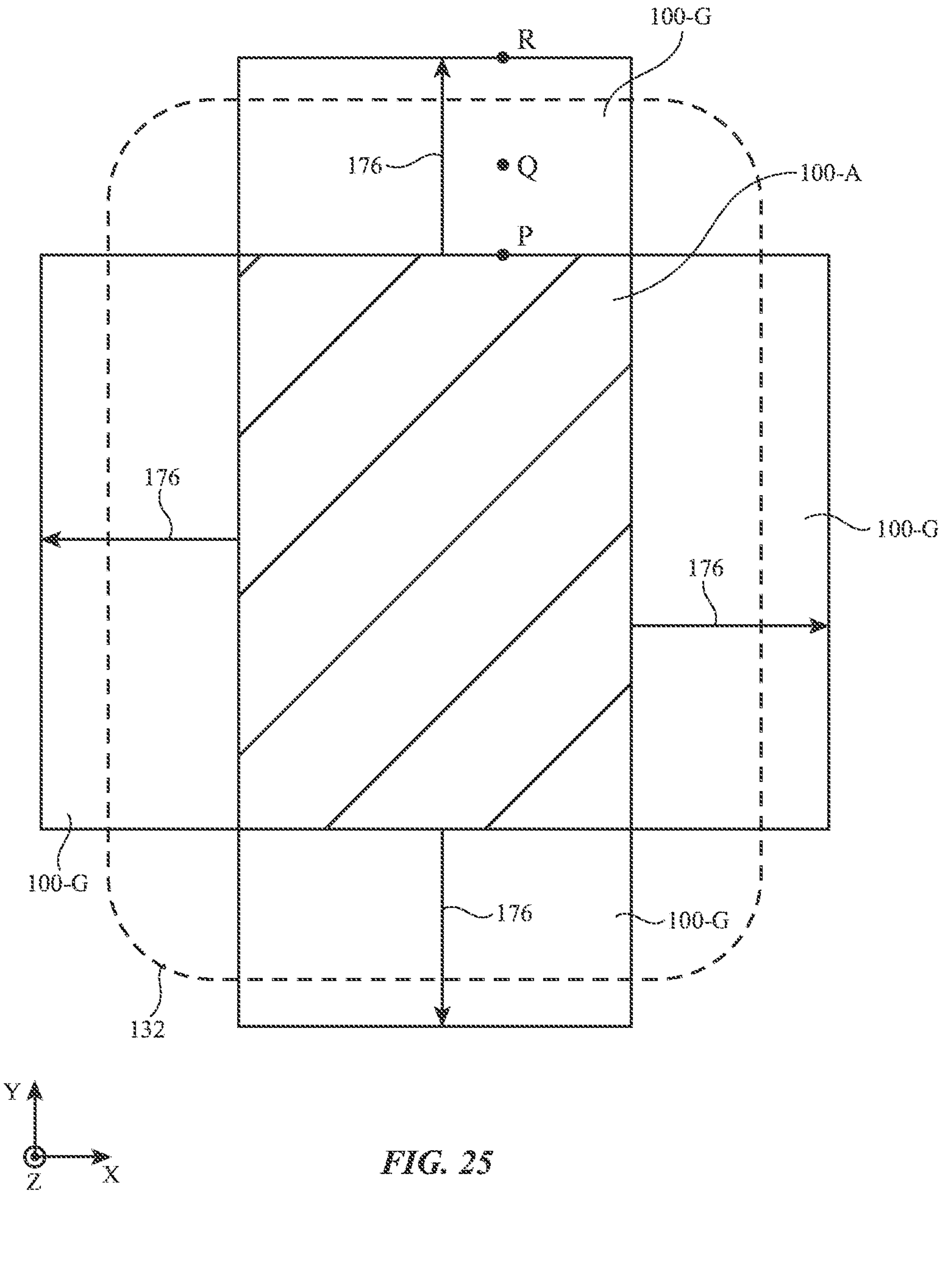
FIG. 25 is a top view of an illustrative patterned backfilm having edge portions with a Young's modulus gradient in accordance with an embodiment.

FIG. 25 is a top view of an illustrative backfilm that includes portions having a Young's modulus gradient. The footprint 132 of the flexible display panel 14 is shown relative to backfilm 100 by the dashed outline in FIG. 25. As shown in FIG. 25, the backfilm may have a central portion 100-H that has a uniform, high Young's modulus (e.g., the central portion may be relatively rigid). Along each edge of the central portion 100-H, a gradient portion 100-G of the backfilm is formed. Each portion 100-G has a Young's modulus gradient. The Young's modulus of each portion 100-G may be at a maximum at the edge of portion 100-G adjacent to central portion 100-H (e.g., at the 100-G/100-H interface). The Young's modulus may gradually decrease with increasing distance from the central portion 100-H. The Young's modulus of each portion 100-G decreases in the direction of arrow 176 (e.g., radially outward away from the center of the backfilm). In other words, each portion 100-G has first and second opposing sides, with the first side being adjacent to central portion 100-H. The Young's modulus decreases from the first side to the second side of each portion 100-G.

At point P (at the 100-G/100-H interface), the Young's modulus of portion 100-G of the backfilm is at a maximum magnitude. Point Q is further from the center of the flexible display panel than point P. Therefore, at point Q the Young's modulus is lower than the Young's modulus at point P. Point R is further from the center of the flexible display panel than point Q. Therefore, at point R the Young's modulus is lower than the Young's modulus at point Q. At point R (at the outer edge of portion 100-G), the Young's modulus of portion 100-G of the backfilm is at a minimum magnitude.

Figure 26:
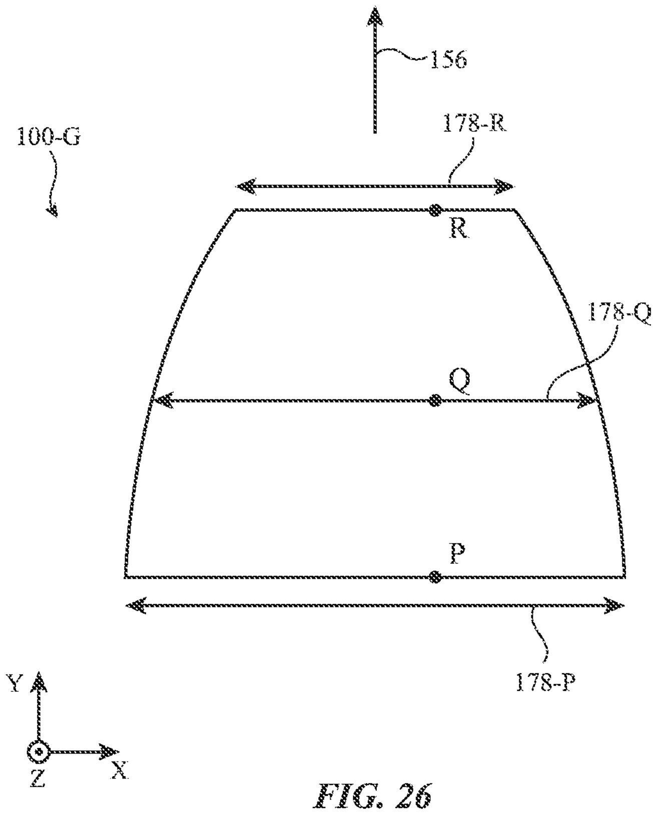
FIG. 26 is a top view of an illustrative portion of a backfilm with a Young's modulus gradient showing how the backfilm shrinks more when stretched when the Young's modulus is low in accordance with an embodiment.

FIG. 26 is a top view of an illustrative portion 100-G of the backing film with a Young's modulus gradient. The Young's modulus of this portion may decrease in the Y-direction (such that the Young's modulus at point P is greater than the Young's modulus at point Q which is greater than the Young's modulus at point R). FIG. 26 shows portion 100-G being stretched in direction 156. According to the Poisson effect, the amount of shrinkage in the backfilm in the direction orthogonal to the direction of stretching (e.g., the transverse direction) is inversely proportional to the Young's modulus. In other words, at point P, the Young's modulus is high. Therefore, minimal shrinkage will occur in the backfilm and portion 100-G has a width 178-P at this point. At point Q, the Young's modulus is lower than at point P. Therefore, more shrinkage will occur at point Q than at point P. Portion 100-G has a width 178-Q that is smaller than width 178-P at this point. At point R, the Young's modulus is lower than at point Q. Therefore, more shrinkage will occur at point R than at point Q. Portion 100-G has a width 178-R that is smaller than width 178-Q at this point.

Figure 27:
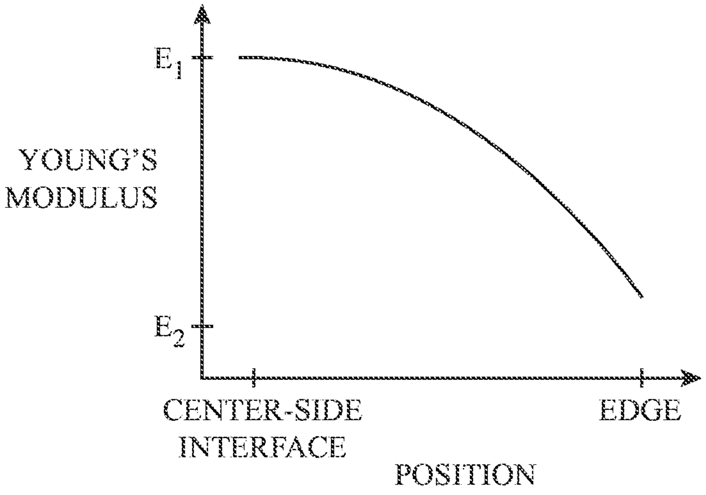
FIG. 27 is a graph of Young's modulus as a function of position for a gradient portion of a patterned backfilm in accordance with an embodiment.
Figure 28:
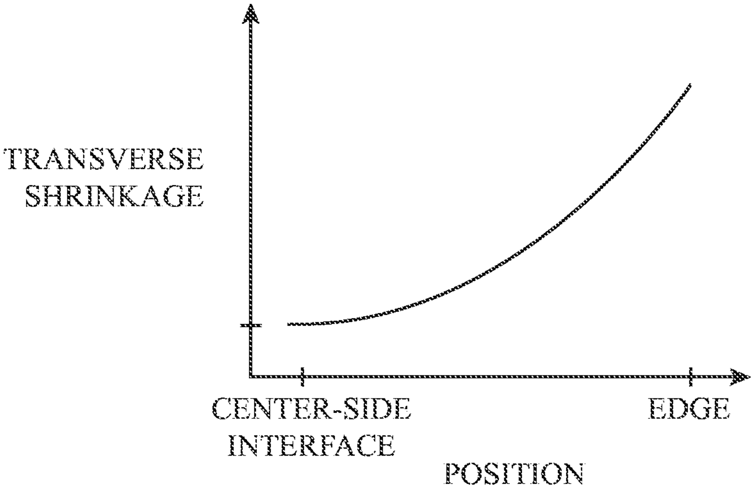
FIG. 28 is a graph of transverse shrinkage as a function of position for a gradient portion of a patterned backfilm in accordance with an embodiment.

FIG. 27 is a graph showing how the Young's modulus of each gradient portion 100-G in the backfilm may gradually decrease from a maximum Young's modulus Er at the center-side interface of portion 100-G (e.g., the 100-G/100-H interface) to a minimum Young's modulus E2 at the outer edge of portion 100-G. FIG. 28 is a graph of transverse shrinkage as a function of position across each portion 100-G of the backfilm (for a Young's modulus profile of the type shown in FIG. 27). As shown, the transverse shrinkage is at a minimum at the center-side interface of portion 100-G (e.g., the 100-G/100-H interface). The transverse shrinkage increases (according to the Young's modulus gradient) to be at a maximum magnitude at the outer edge of portion 100-G.

The Young's modulus gradient may therefore be selected to cause a transverse shrinkage profile during stretching that mirrors the amount of extra material in the flexible display panel (e.g., as shown in FIG. 11). The backfilm therefore applies a compressive force to the extra display panel material at a magnitude that is proportional to the amount of extra material. This mitigates wrinkling without causing high tension strain.

Figure 29:
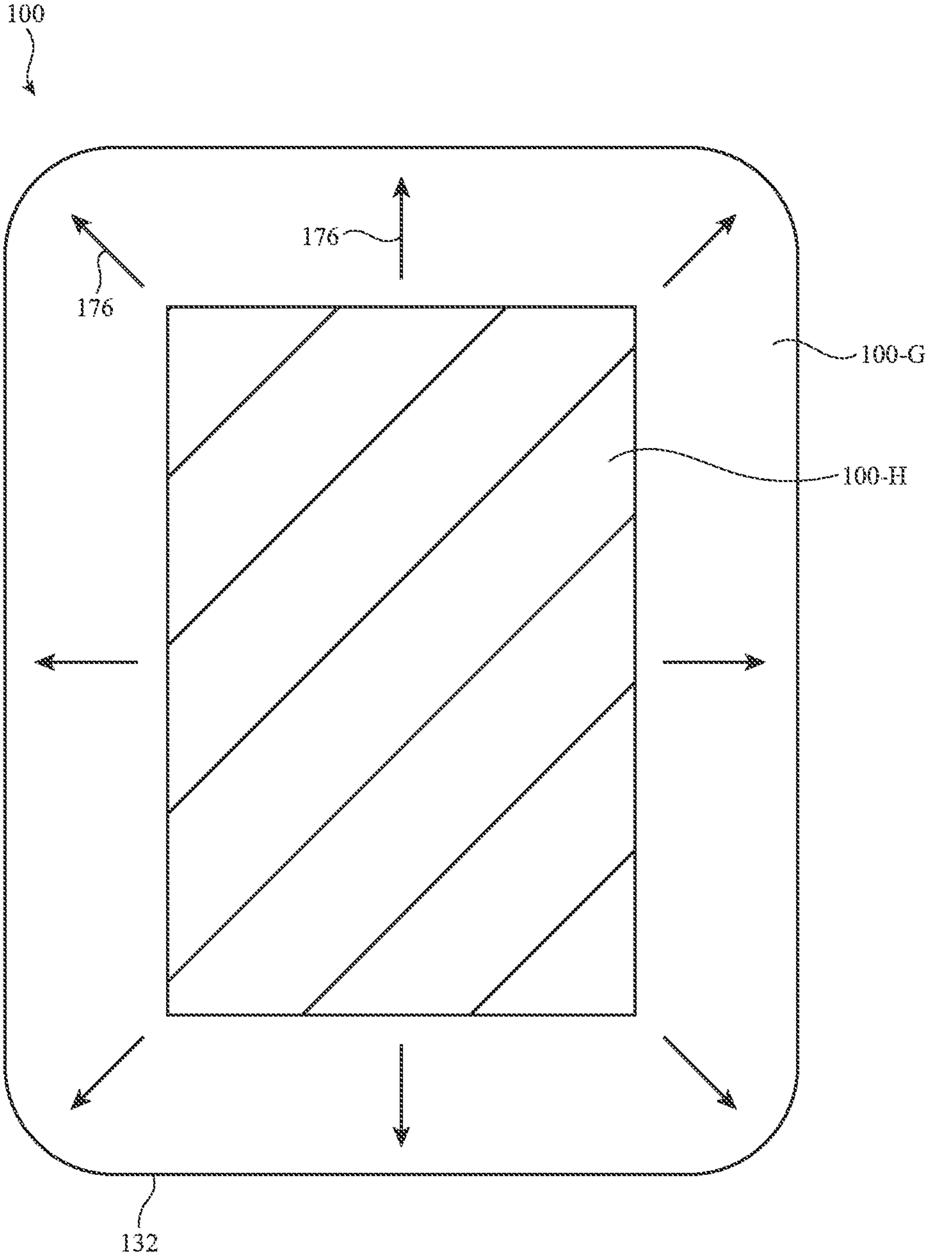
FIG. 29 is a top view of an illustrative patterned backfilm having a ring around the periphery of the backfilm with a Young's modulus gradient in accordance with an embodiment.

The arrangement of the backfilm shown in FIG. 25 is merely illustrative. FIG. 29 is a top view of a backfilm that has a high Young's modulus central portion 100-H and that is surrounded by a gradient portion 100-G. The gradient portion may form a uniform ring around the periphery of the central portion. The gradient portion may have a Young's modulus that decreases in direction 176 (e.g., decreases radially outwards away from the center of the backfilm/display panel in all directions).

Figure 30:
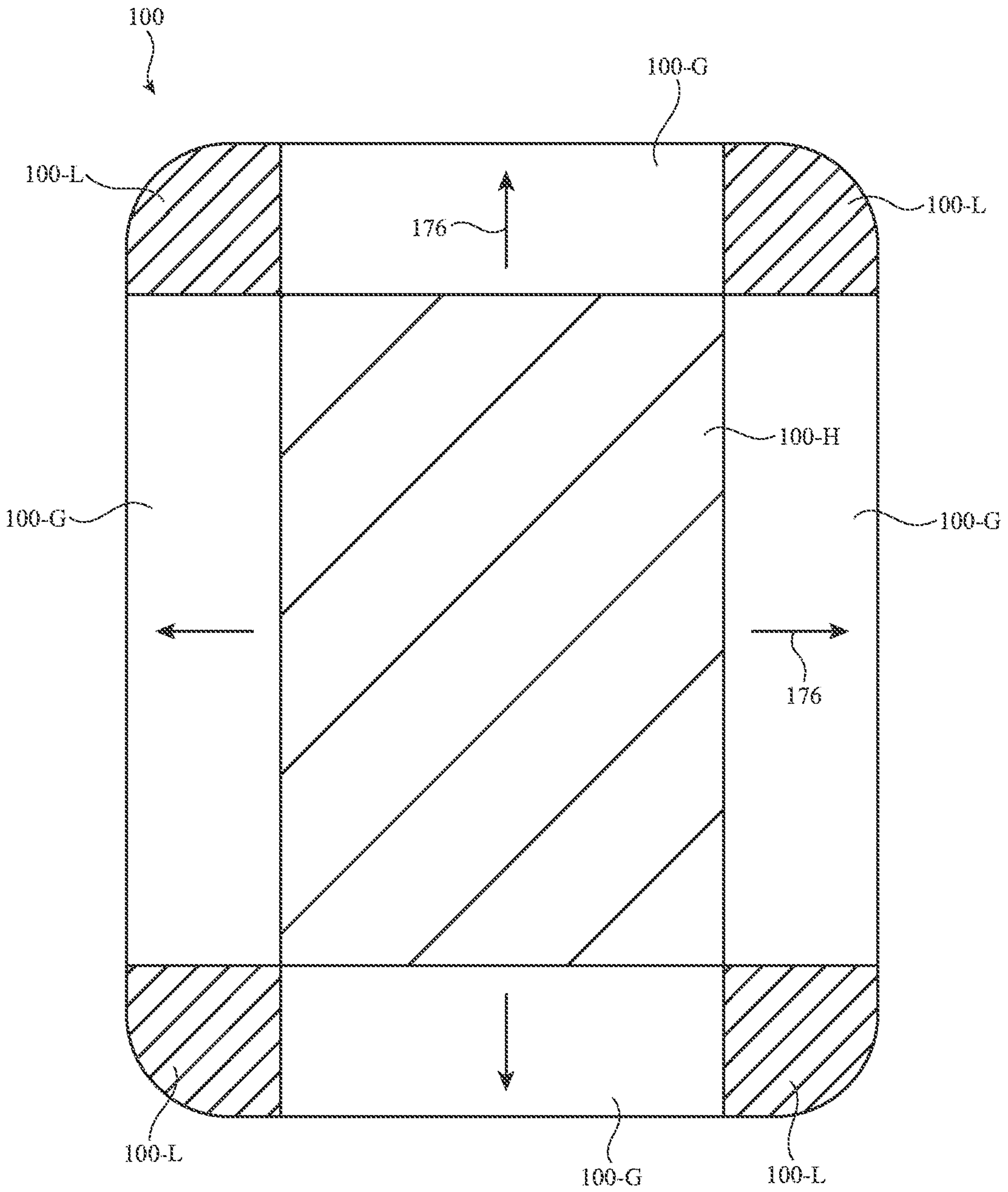
FIG. 30 is a top view of an illustrative patterned backfilm having edge portions with a Young's modulus gradient and low Young's modulus corner portions in accordance with an embodiment.

FIG. 30 is a top view of yet another possible arrangement for a backfilm with a gradient Young's modulus portion. As shown in FIG. 30, the backfilm may have the same arrangement as in FIG. 25, with a central high Young's modulus portion and four surrounding gradient portions 100-G adjacent to each of the four edges of the central portion. Additionally, low Young's modulus portions 100-L may be formed in the rounded corners in the gaps between the adjacent gradient portions 100-G. The low Young's modulus portions may have a Young's modulus that is less than that of high Young's modulus portion 100-H. The low Young's modulus portions may have Young's modulus that is less than or equal to the lowest Young's modulus in the gradient portions 100-G.

Figure 31:
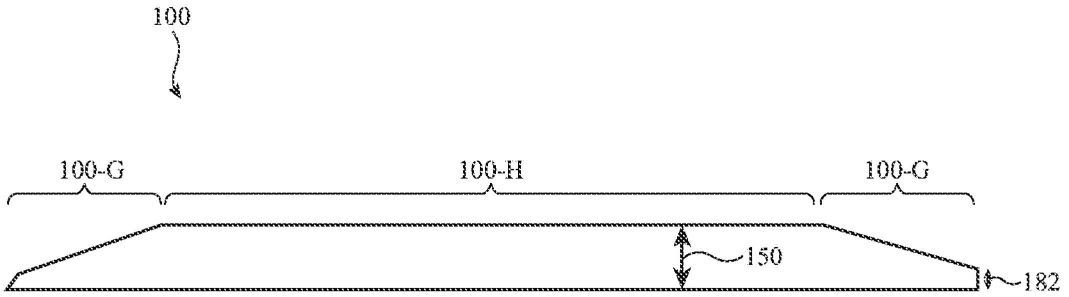
FIG. 31 is a cross-sectional side view of an illustrative backfilm showing how the backfilm may include a thickness gradient instead of or in addition to a Young's modulus gradient in accordance with an embodiment.

Thus far, the gradient portions 100-G have been described as having a varying Young's modulus. However, the gradient portions 100-G may instead have a varying thickness. In other words, instead of a layer with a uniform thickness and a varying Young's modulus, a gradient portion of the backfilm may have a layer with varying thickness and uniform Young's modulus. FIG. 31 is a cross-sectional side view of a backfilm showing an arrangement of this type. As shown, in a central portion 100-H the thickness of the layer is uniform. In gradient portions 100-G, the thickness decreases with increasing distance away from the center of the backfilm and towards the edge of the backfilm. In gradient portion 100-G, the thickness gradually transitions from a maximum thickness of 180 to a minimum thickness of 182.

Figure 32:
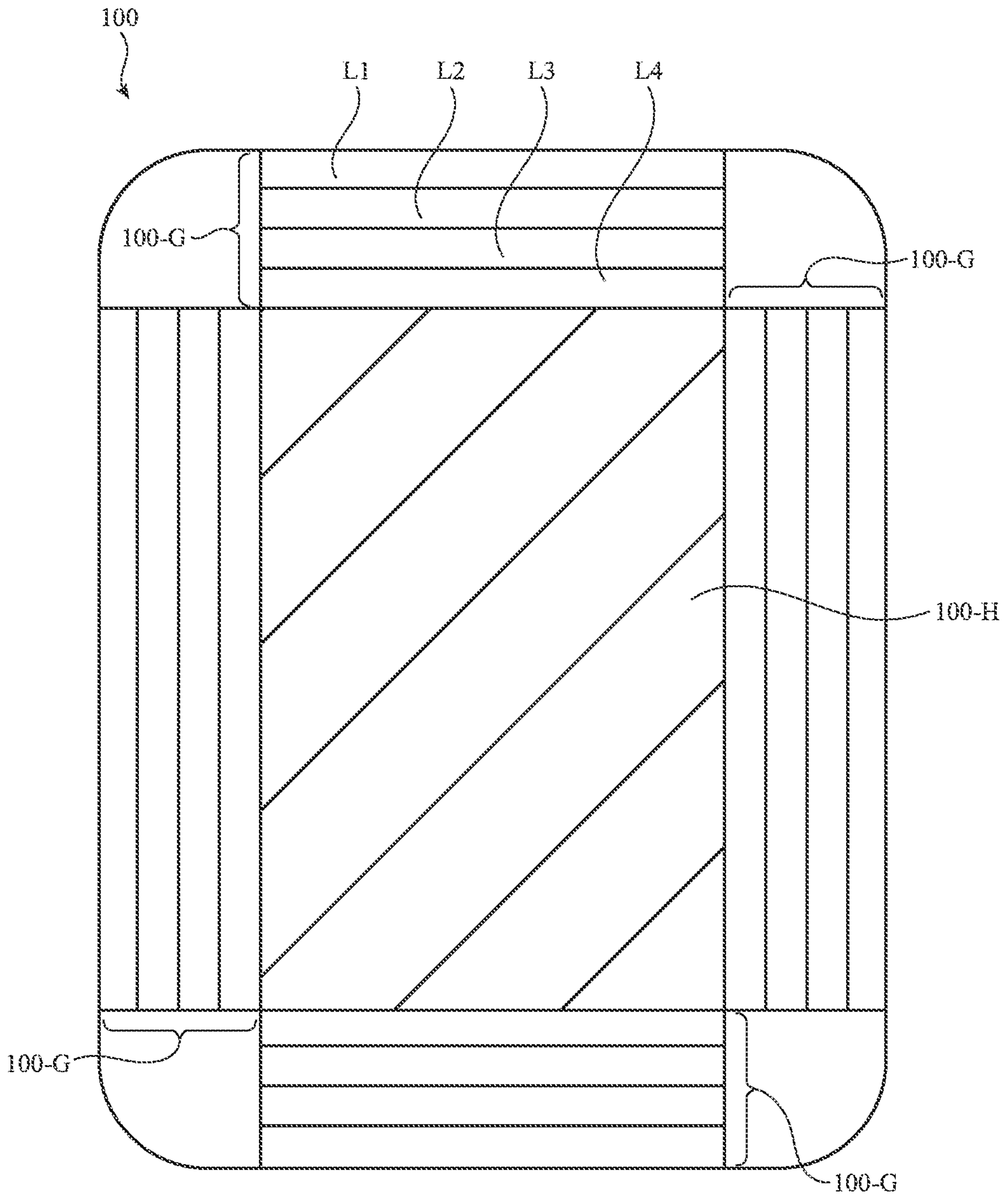
FIG. 32 is a top view of an illustrative patterned backfilm having edge portions with a Young's modulus gradient that follows a step function in accordance with an embodiment.

In the gradient portions of the backfilm, the Young's modulus (and/or thickness) may gradually change as a function of position (e.g., continuously and monotonically decrease). Alternatively, the Young's modulus (and/or thickness) may change according to a step function. FIG. 32 is a top view of a backfilm of this type. As shown, each gradient portion 100-G is formed from four layers (L1, L2, L3, and L4). Each layer has a uniform Young's modulus (and/or thickness). However, the Young's modulus (and/or thickness) of each layer is based on the distance of that layer from the center of the backfilm. For example, L4 is closest to the center of the backfilm and therefore has the highest Young's modulus. L3 is further from the center of the backfilm than L4 and therefore has a lower Young's modulus than L4. L2 is further from the center of the backfilm than L3 and therefore has a lower Young's modulus than L3. L1 is further from the center of the backfilm than L2 and therefore has a lower Young's modulus than L2. Any desired number of layers may be used to form each gradient portion 100-G (e.g., at least two layers, at least three layers, at least four layers, etc.).

Figure 33:
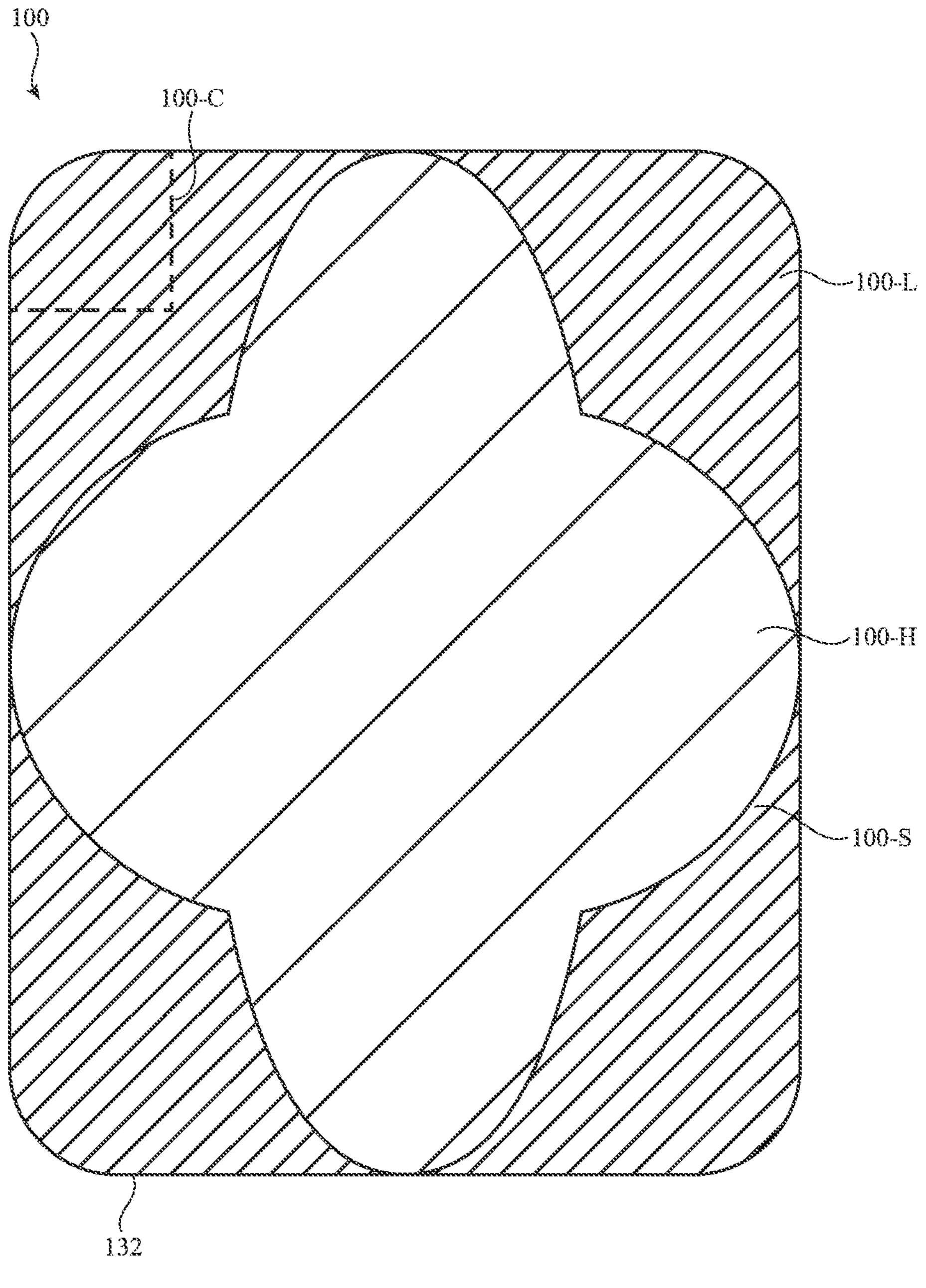
FIG. 33 is a top view of an illustrative patterned backfilm having a high Young's modulus portion and a low Young's modulus portion in accordance with an embodiment.

FIG. 33 is a top view of another arrangement for a backfilm. In this arrangement, there is a first portion 100-H that has a first, uniform (high) Young's modulus and a second portion 100-L that has a second, uniform (low) Young's modulus. The Young's modulus of portion 100-L may be lower than that of portion 100-H. Portion 100-H may be defined by four curved surfaces 100-S that each extend to the edge of footprint 132. The four curved surfaces may have a uniform radius of curvature or a varying radius of curvature. Each curved surface may meet first and second adjacent curved surfaces on each side of that curved surface. The low Young's modulus portion 100-L may fill the remainder of the footprint of the flexible display panel (e.g., in the rounded corner regions of the flexible display panel). If desired, there may be a cutout in each corner region 100-C in the low Young's modulus portion 100-L.

With the pattern of FIG. 33, low Young's modulus portion 100-L has an increasing amount of material with increasing distance from the center of the display panel. This matches the profile of the extra material in the flexible display panel caused by the three-dimensional bending (as shown in FIG. 11) and therefore effectively mitigates wrinkling from the extra material.

If desired, the pre-stretching technique shown in FIG. 22 may be applied to a backfilm that is a uniform layer having the same footprint-shape as the flexible display panel (e.g., a rectangular shape with rounded corners). The backfilm may have a larger footprint than the flexible display panel (to provide space for clamping during the stretching process). Shrinkage of a backfilm of this shape (e.g., after being released from the stretched state) may effectively mitigate wrinkling and reduce strain within the display panel. If desired, the backfilm may instead or in addition provide shrinkage in any other form (e.g., thermal shrinkage or chemical shrinkage during curing) to mitigate wrinkling and cracking of the display panel.

In connection with FIG. 22, an alternate process was discussed where the backing film is stretched before being attached to the flexible display panel (and therefore before the molding step). A method of this type is shown in FIG. 34.

Figure 34:
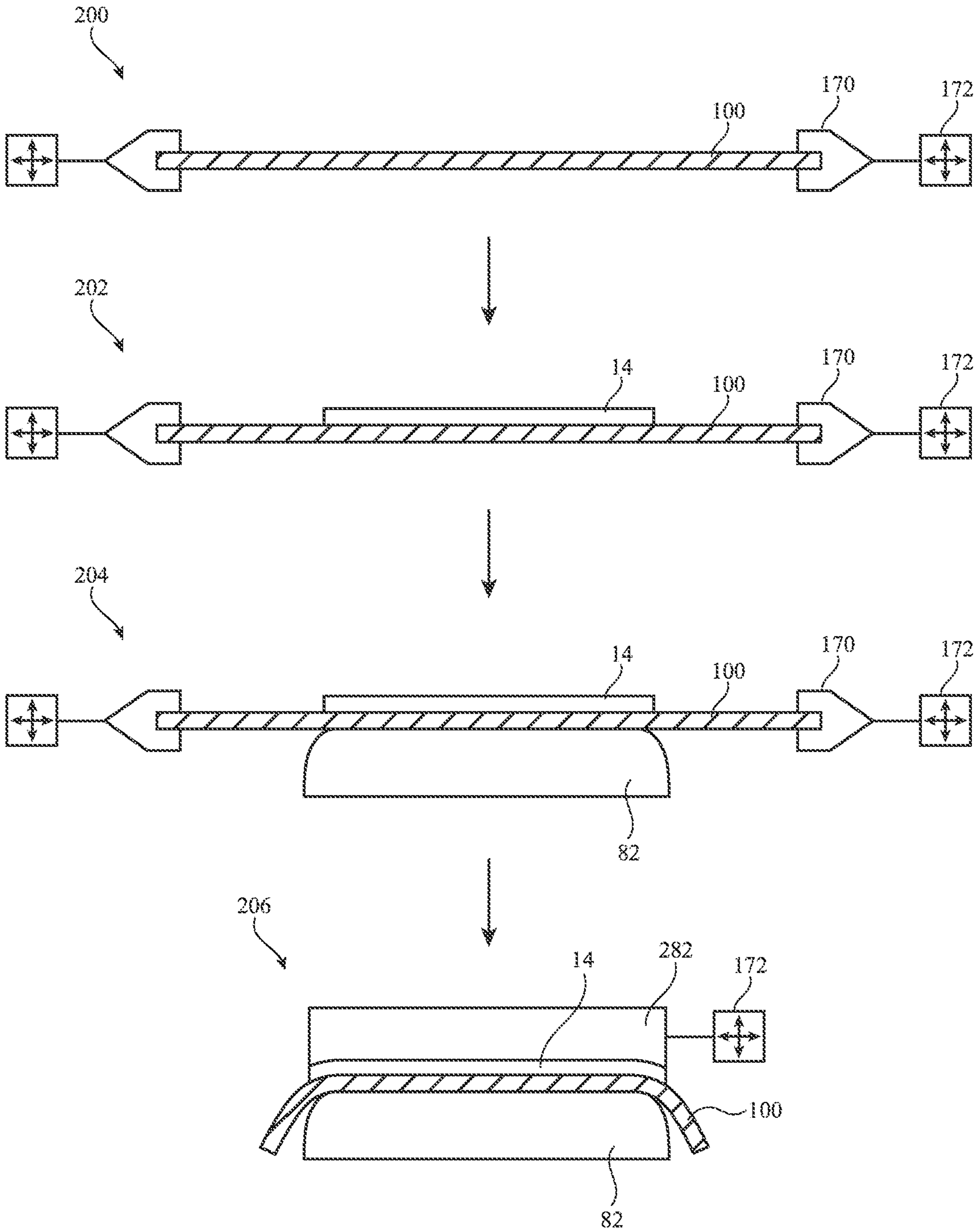
FIG. 34 is a cross-sectional side view of a flexible display panel during a molding process in which a backfilm is pre-stretched in accordance with an embodiment.

FIG. 34 is a cross-sectional side view of a bending process for a flexible display panel showing how a backfilm may be stretched to mitigate wrinkling in the flexible display panel. At step 200, backfilm 100 is stretched. Clamps 170 are attached to the edges of backfilm 100. The clamps 170 may be controlled by computer-controlled positioners 172, as an example. During the stretching process of step 200, clamps 170 may pull backfilm 100 outwards radially (e.g., as shown in FIG. 21) to stretch the backfilm. Due to Poisson's effect, the backfilm shrinks in the transverse direction (e.g., orthogonal to the radial direction around the periphery of the backfilm) while stretched. As shown in FIG. 34, backfilm 100 may initially have a footprint that is larger than the footprint of display 14. This provides space for the backfilm to be clamped during the stretching process.

Next, at step 202, the flexible display panel 14 is attached to backfilm 100. Lamination of flexible display panel 14 to backfilm 100 may be performed while backfilm 100 is still being stretched by clamps 170.

Subsequently, at step 204, the flexible display panel 14 and backfilm 100 are attached to mold 82. After attaching backfilm 100 and flexible display panel 14 to mold 82 (and before pressing backfilm 100 and flexible display panel 14 into mold 82), clamps 170 may release the backfilm to cease stretching the backfilm.

Subsequently, at step 206, an additional mold 282 (sometimes referred to as top mold 282) may be pressed into the flexible display panel 14, backfilm 100, and mold 82 (sometimes referred to as bottom mold 82). While top mold 282 presses into bottom mold 82 (and applies desired curvature to flexible display panel 14), the adhesive between backfilm 100 and bottom mold 82 may be cured. The top and bottom molds may then be removed to produce a flexible display panel having desired curvature.

Subsequent to step 206, a display cover layer 40 may be laminated to display panel 14 (e.g., using an optically clear adhesive), similar to as shown in FIG. 22. Additionally, excess material in the backfilm (e.g., material that extends past the footprint of the display panel) may be trimmed. After the process of FIG. 34 is complete, display cover layer 40, flexible display panel 14, and backfilm 100 may each have four edges that are bent along a single axis (e.g., not compound curvature) and four corner regions having compound curvature, with each corner region being interposed between two adjacent edges. Each layer of display cover layer 40, flexible display panel 14, and backfilm 100 may have the same curvature (e.g., the layers may be conformal).

It should be noted that, in each of FIGS. 23-25 and 29-33, the backfilm may initially have one or more portions that extend beyond the footprint of the display (as shown in FIG. 22, step 164 and FIG. 25, for example). These portions provide an area for the backfilm to be clamped during the stretching process. After the backfilm is laminated to the display panel, the backfilm is trimmed to have no portions that extend beyond the edge of the flexible display panel (as shown in FIGS. 23, 24, and 29-33, for example).

The materials used to form any of the aforementioned backing films may have a Young's modulus magnitude (in GPa) greater than 0.1, greater than 0.5, greater than 1, greater than 2, greater than 3, greater than 5, greater than 8, greater than 10, less than 10, less than 5, less than 3, less than 2, less than 1, less than 0.5, between 0.5 and 5, between 0.1 and 10, between 0.5 and 3, etc. The difference (in GPa) in Young's modulus between the maximum Young's modulus of a gradient portion of the backing film and the minimum Young's modulus of a gradient portion of the backing film may be greater than 0.01, greater than 0.1, greater than 0.2, greater than 0.3, greater than 0.5, greater than 1, greater than 3, greater than 10, greater than 50, less than 5, between 0.01 and 5, etc. The difference in Young's modulus between a high Young's modulus portion of the backing film (e.g., 100-H in FIG. 33) and a low Young's modulus portion of the backing film (e.g., 100-L in FIG. 33) may be greater than 0.01, greater than 0.1, greater than 0.2, greater than 0.3, greater than 0.5, greater than 1, greater than 3, greater than 10, greater than 50, less than 5, between 0.01 and 5, etc.

Figure 24B:
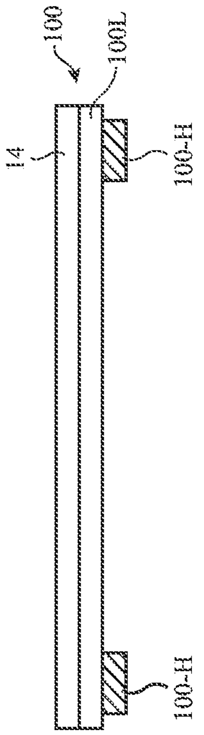
FIG. 24B is a cross-sectional side view of an illustrative backfilm with different materials formed in stacked layers in accordance with an embodiment.
Figure 24A:
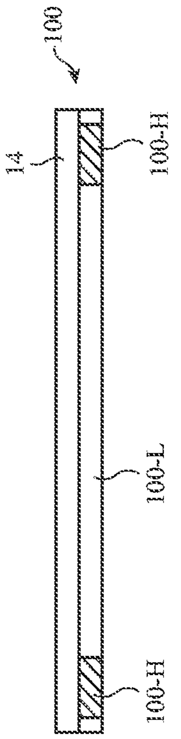
FIG. 24A is a cross-sectional side view of an illustrative backfilm with different materials formed in a single layer in accordance with an embodiment.

For any of the aforementioned embodiments, the backfilm may have a single-layer arrangement (e.g., as in FIG. 24A) or a multi-layer arrangement (e.g., as in FIG. 24B). For example, the backfilm portions 100-L and 100-H may be formed as coplanar parts of a single layer or may be formed from stacked layers (e.g., a patterned portion 100-H may be formed on a blanket layer 100-L that covers the entire footprint or the entire footprint except for cutouts in the rounded corner regions).

It should be noted that any of the backfilms described herein may optionally include conductive traces and/or vias. The backfilm may be electrically connected to the flexible display panel in these types of embodiments. As one example, the backfilm may be part of an electrical interconnection between the flexible display panel and a printed circuit board (e.g., motherboard) in the electronic device.

Any of the backfilms described herein may be used to form a touch-sensitive layer for display 14. The backfilm may include touch-sensing electrodes to provide touch-sensing functionality for display 14. Forming the touch-sensitive layer separately from the display panel (e.g., in the backfilm) may be referred to as a discrete touch-sensing arrangement. Discrete touch-sensing using the backfilm may be used in any desired type of display (e.g., OLED displays, microLED displays, etc.). As yet another possible arrangement, a discrete touch-sensitive layer may be included in device 10 addition to the display panel and a separate backfilm.

In another embodiment, touch-sensing electrodes may be deposited directly onto the display stack. Forming the touch-sensitive layer in the display stack in this manner may be referred to as an embedded touch-sensing arrangement. Embedded touch-sensing may be used in any desired type of display (e.g., OLED displays, microLED displays, etc.) with any of the backfilms described herein.

In accordance with an embodiment, an electronic device is provided that includes a display panel that displays an image, the display panel has a rounded corner with compound curvature; a display cover layer that covers the display panel; and a patterned film that is attached to the display panel, the display panel is interposed between the patterned film and the display cover layer and the patterned film has a portion with a higher coefficient of thermal expansion than the display panel.

In accordance with another embodiment, the portion is a corner portion that overlaps the rounded corner of the display panel.

In accordance with another embodiment, the corner portion has first and second orthogonal edges and a curved edge that connects the first and second orthogonal edges.

In accordance with another embodiment, the rounded corner of the display panel is one of four rounded corners, the display panel includes four edges that are each interposed between two of the four rounded corners, and the portion is an edge portion that overlaps one of the four edges of the display panel.

In accordance with another embodiment, the edge portion of the patterned film includes an increasing amount of material with increasing distance from the center of the display panel.

In accordance with another embodiment, the edge portion of the patterned film includes first and second curved surfaces that meet at a vertex.

In accordance with another embodiment, the edge portion of the patterned film includes a curved surface that has concave curvature.

In accordance with another embodiment, the portion has a coefficient of thermal expansion gradient.

In accordance with another embodiment, a coefficient of thermal expansion of the portion increases with increasing distance from a center of the display panel.

In accordance with another embodiment, the portion has an anisotropic coefficient of thermal expansion.

In accordance with another embodiment, the portion has the same coefficient of thermal expansion as the display panel in a first direction that extends radially outward from a center of the display panel and the portion has the higher coefficient of thermal expansion than the display panel in a second direction that is orthogonal to the first direction.

In accordance with an embodiment, an electronic device is provided that includes a display panel that displays an image, the display panel has a rounded corner with compound curvature; a display cover layer that covers the display panel; and a film that is attached to the display panel, the display panel is interposed between the film and the display cover layer and the film has a first portion with a first Young's modulus and a second portion with a second Young's modulus that is different than the first Young's modulus.

In accordance with another embodiment, the first and second portions are coplanar.

In accordance with another embodiment, the first and second portions are overlapping layers.

In accordance with another embodiment, the second Young's modulus is higher than the first Young's modulus and the second portion is a patch that overlaps the rounded corner of the display panel.

In accordance with another embodiment, the second portion is laterally surrounded by the first portion.

In accordance with another embodiment, the second portion has a Young's modulus gradient and a Young's modulus of the second portion decreases with increasing distance from a center of the display panel.

In accordance with an embodiment, an electronic device is provided that includes a display panel that displays an image, the display panel has a rounded corner with compound curvature; a display cover layer that covers the display panel; and a film that is attached to the display panel, the display panel is interposed between the film and the display cover layer and the film has a first portion with a first thickness and a second portion with a second thickness that is different than the first thickness.

In accordance with another embodiment, the second portion has a thickness gradient and a thickness of the second portion decreases with increasing distance from a center of the display panel.

In accordance with another embodiment, the second portion overlaps an edge of the display panel.

The foregoing is merely illustrative and various modifications can be made to the described embodiments. The foregoing embodiments may be implemented individually or in any combination.

What is claimed is:

1. An electronic device comprising:

a display panel that displays an image, wherein the display panel has a rounded corner that is bent about two axes;

a display cover layer that covers the display panel; and a patterned film that is attached to the display panel, wherein the display panel is interposed between the patterned film and the display cover layer and wherein the patterned film has a portion with a higher coefficient of thermal expansion than the display panel.

2. The electronic device defined in claim 1, wherein the portion is a corner portion that overlaps the rounded corner of the display panel and wherein the corner portion has first and second orthogonal edges and a curved edge that connects the first and second orthogonal edges.

3. The electronic device defined in claim 1, wherein the rounded corner of the display panel is one of four rounded corners, wherein the display panel includes four edges that are each interposed between two of the four rounded corners, and wherein the portion is an edge portion that overlaps one of the four edges of the display panel.

4. The electronic device defined in claim 3, wherein the display panel emits light in a first direction and wherein the edge portion of the patterned film includes an increasing amount of material with increasing distance from a center of the display panel in a second direction orthogonal to the first direction.

5. The electronic device defined in claim 4, wherein the edge portion of the patterned film includes first and second curved surfaces that meet at a vertex.

6. The electronic device defined in claim 4, wherein the edge portion of the patterned film includes a curved surface that has concave curvature.

7. The electronic device defined in claim 1, wherein the portion has a coefficient of thermal expansion gradient.

8. The electronic device defined in claim 7, wherein the display panel emits light in a first direction and wherein a coefficient of thermal expansion of the portion increases with increasing distance from a center of the display panel in a second direction orthogonal to the first direction.

9. The electronic device defined in claim 1, wherein the portion has an anisotropic coefficient of thermal expansion.

10. The electronic device defined in claim 9, wherein the portion has the same coefficient of thermal expansion as the display panel in a first direction that extends radially outward from a center of the display panel and wherein the portion has the higher coefficient of thermal expansion than the display panel in a second direction that is orthogonal to the first direction.

11. An electronic device comprising:

a display panel that displays an image, wherein the display panel has a rounded corner with compound curvature;

a display cover layer that covers the display panel; and a film that is attached to the display panel, wherein the display panel is interposed between the film and the display cover layer, wherein the film has a first portion with a first Young's modulus and a second portion with a second Young's modulus that is different than the first Young's modulus, and wherein the first and second portions are coplanar.

12. The electronic device defined in claim 11, wherein the first and second portions have a uniform thickness.

13. The electronic device defined in claim 11, wherein the display panel emits light in a first direction and wherein the first and second portions overlap in a second direction orthogonal to the first direction.

14. The electronic device defined in claim 11, wherein the second Young's modulus is higher than the first Young's modulus and wherein the second portion is a patch that overlaps the rounded corner of the display panel.

15. The electronic device defined in claim 14, wherein the second portion is laterally surrounded by the first portion.

16. The electronic device defined in claim 11, wherein the second portion has a Young's modulus gradient and wherein a Young's modulus of the second portion decreases with increasing distance from a center of the display panel.

17. An electronic device comprising:

a display panel that displays an image, wherein the display panel has a rounded corner with compound curvature;

a display cover layer that covers the display panel; and a film that is attached to the display panel, wherein the display panel is interposed between the film and the display cover layer and wherein the film has a first portion with a first thickness and a second portion with a second thickness that is different than the first thickness.

18. The electronic device defined in claim 17, wherein the second portion has a thickness gradient and wherein a thickness of the second portion decreases with increasing distance from a center of the display panel.

19. The electronic device defined in claim 18, wherein the second portion overlaps an edge of the display panel.

20. The electronic device defined in claim 17, wherein the display panel emits light in a direction, wherein the first thickness of the first portion is parallel to the direction, and wherein the second thickness of the second portion is parallel to the direction.

* * * * *